United States Patent
Dick et al.

(10) Patent No.: US 10,411,656 B1
(45) Date of Patent: Sep. 10, 2019

(54) METHOD OF AND CIRCUIT FOR CREST FACTOR REDUCTION FOR A CABLE TV AMPLIFIER

(71) Applicant: Xilinx, Inc., San Jose, CA (US)

(72) Inventors: Christopher H. Dick, San Jose, CA (US); Hongzhi Zhao, Los Gatos, CA (US); Hemang M. Parekh, San Jose, CA (US); Xiaohan Chen, Sunnyvale, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/142,893

(22) Filed: Sep. 26, 2018

(51) Int. Cl.
*H03F 1/32* (2006.01)
*H04L 27/26* (2006.01)
*H04B 1/04* (2006.01)
*H04N 5/38* (2006.01)
*H04L 27/08* (2006.01)

(52) U.S. Cl.
CPC .............. *H03F 1/3241* (2013.01); *H04B 1/04* (2013.01); *H04L 27/08* (2013.01); *H04L 27/2623* (2013.01); *H04N 5/38* (2013.01); *H04B 2001/0408* (2013.01)

(58) Field of Classification Search
CPC ......... H03F 1/3241; H04B 1/04; H04L 27/08; H04L 27/2623; H04N 5/38
See application file for complete search history.

(56) References Cited

U.S. PATENT DOCUMENTS 5,252,930 A * 10/1993 Blauvelt ............... H03F 1/3252
327/100

OTHER PUBLICATIONS

Ghannouchi, Fadhel M. et al., "Behavioral Modeling and Predistortion of Wideband Wireless Transmitters," pp. 20-121, May 15, 2015, John Wiley & Sons Ltd., Hoboken, New Jersey, USA.

* cited by examiner

Primary Examiner — Jaison Joseph
(74) *Attorney, Agent, or Firm* — David W. O'Brien

(57) ABSTRACT

A crest factor reduction (CFR) system includes a digital tilt filter coupled to an input of the CFR system. In some embodiments, the digital tilt filter is configured to receive a system input signal and generate a digital tilt filter output signal at a digital tilt filter output. In some examples, the CFR system further includes a CFR module coupled to the digital tilt filter output, where the CFR module is configured receive the digital tilt filter output signal and perform a CFR process to the digital tilt filter output signal to generate a CFR module output signal at a CFR module output. In addition, the CFR system may include a digital tilt equalizer coupled to the CFR module output, where the digital tilt equalizer is configured to receive the CFR module output signal and generate a system output signal.

20 Claims, 15 Drawing Sheets

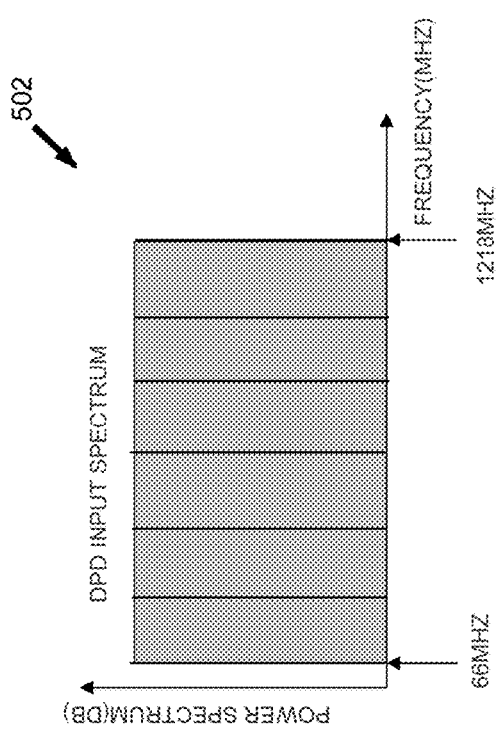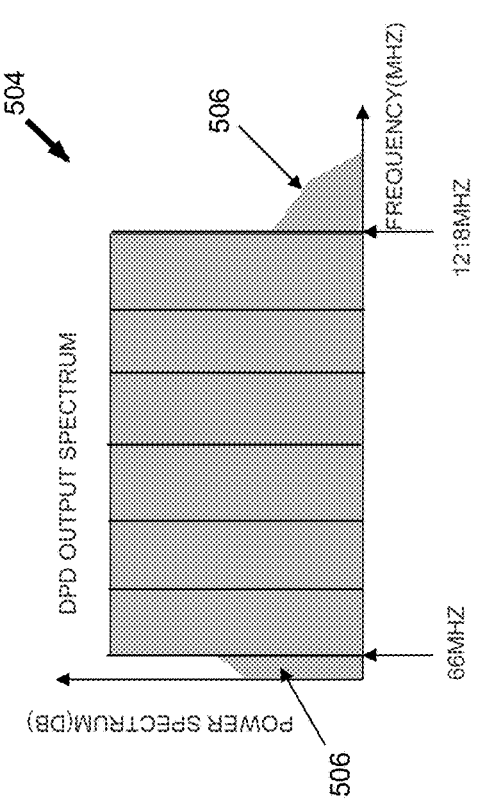
FIG. 5A
FIG. 5B

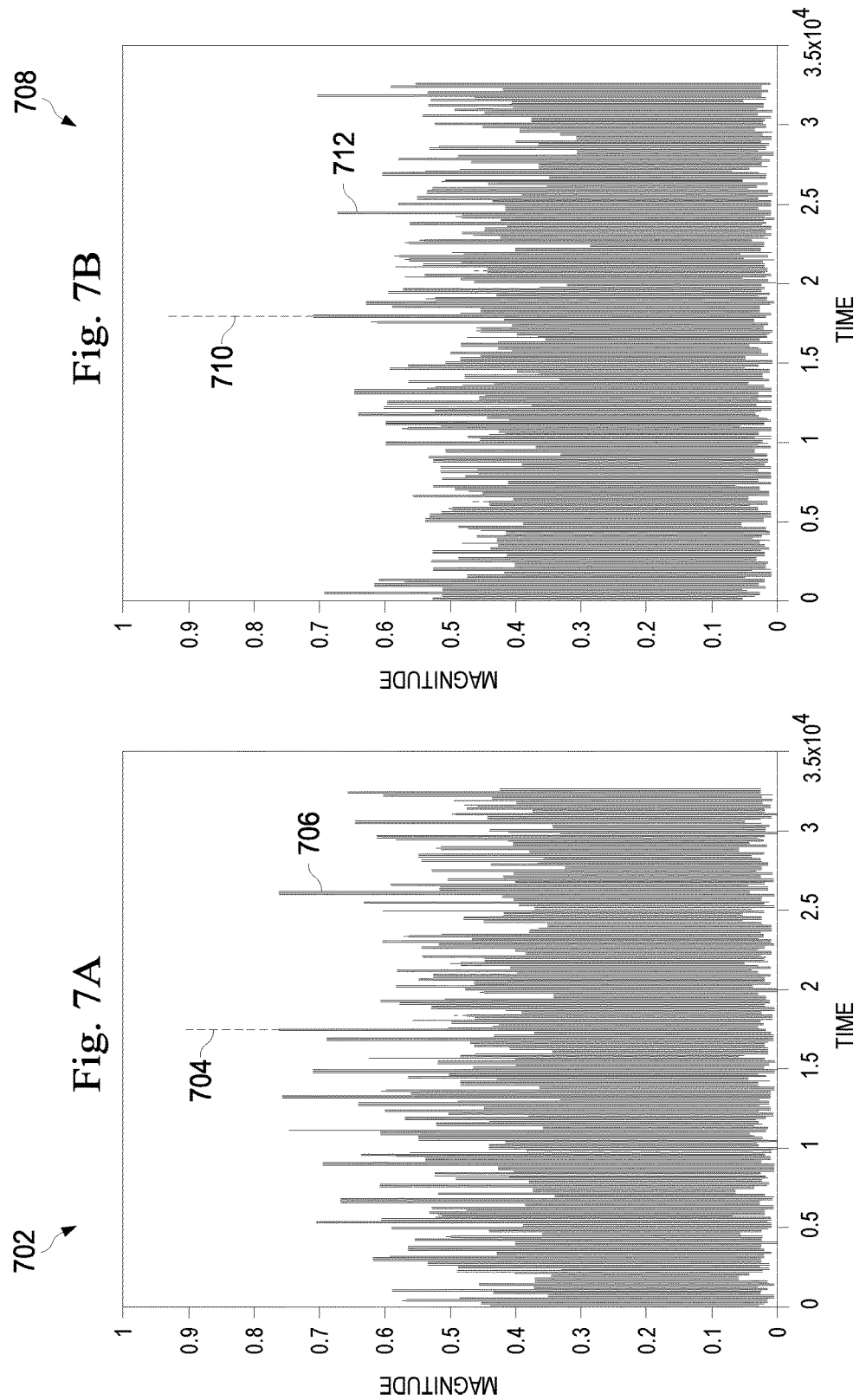

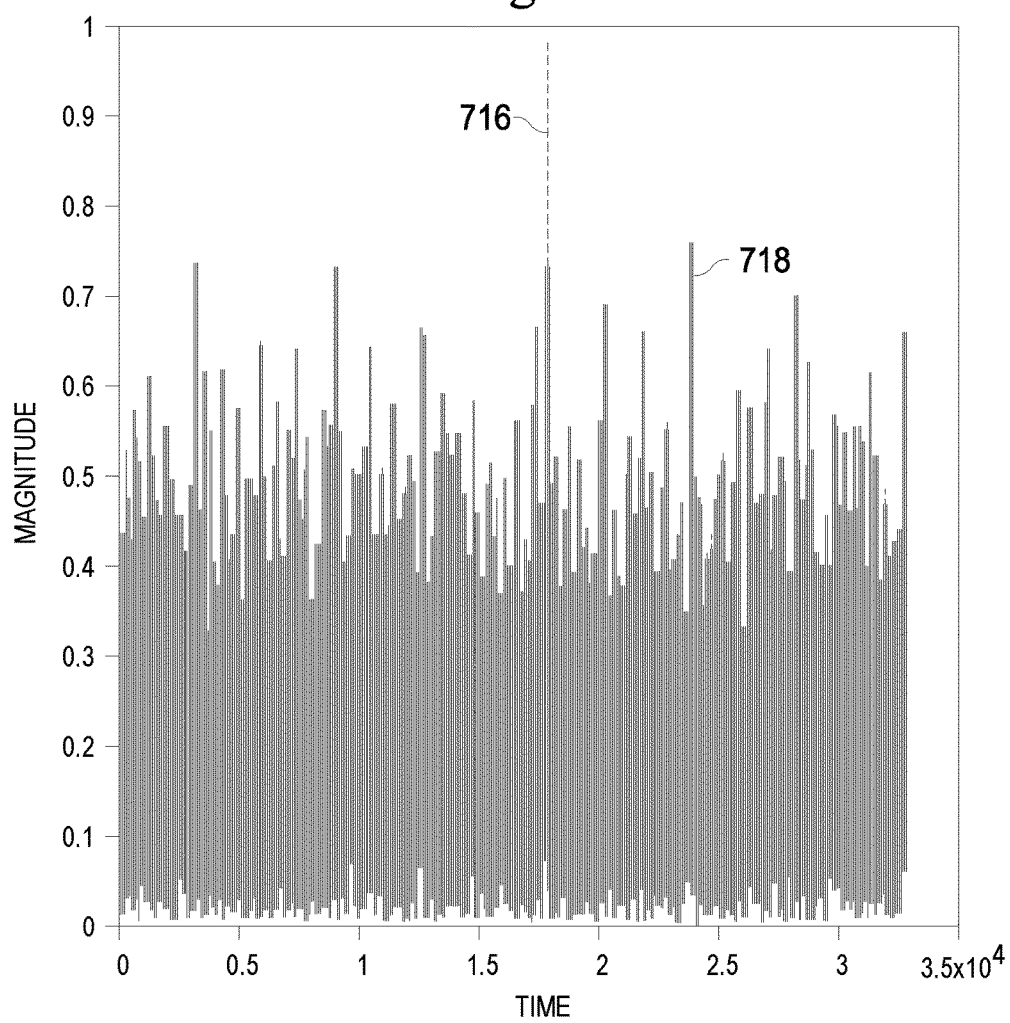

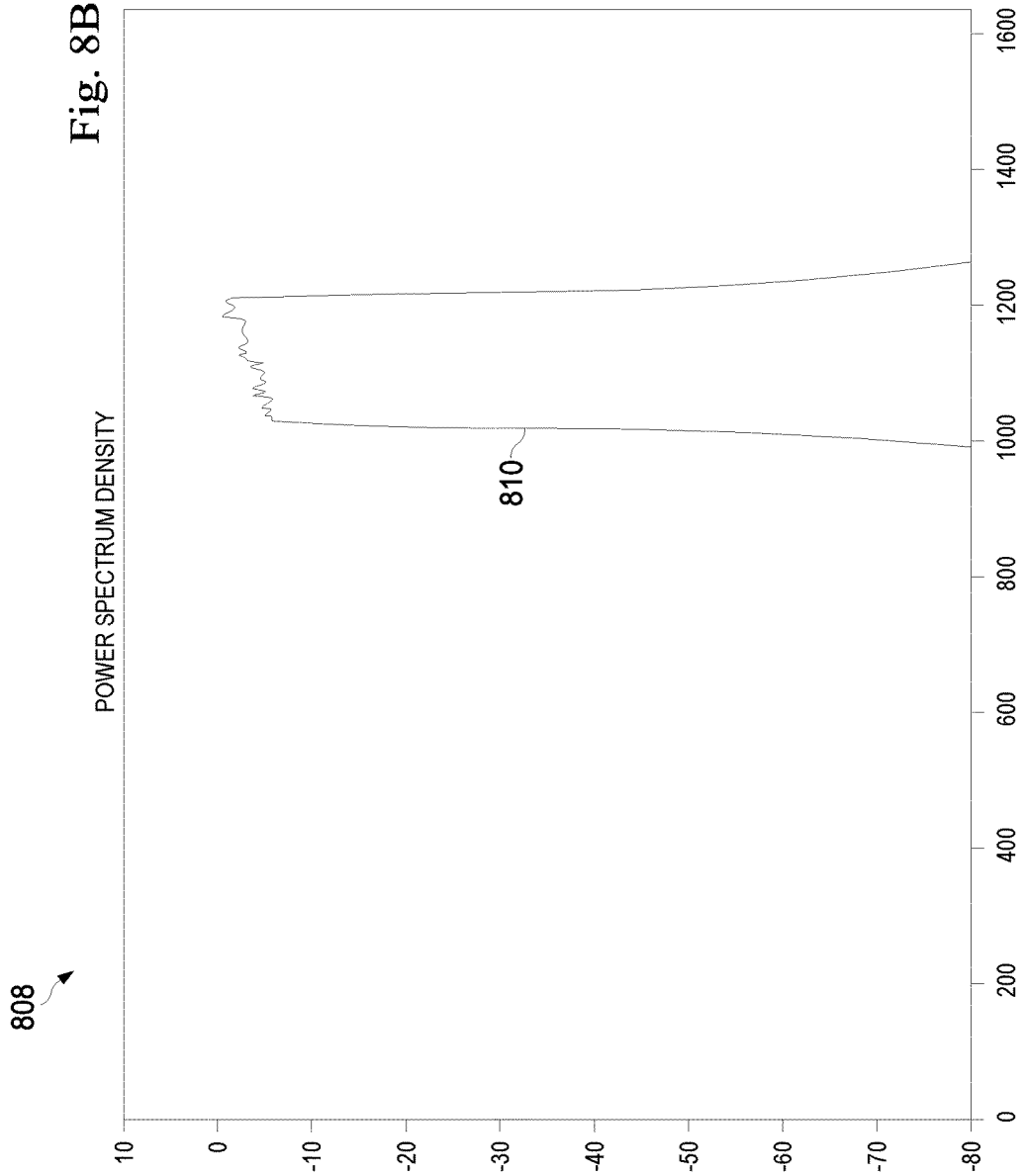

| CATV Amplifier Under Test, Vd =34V. DOCSIS 3.1 Specs : 41dB, 4KQAM, 76.8dBmv/75Ω. | | | | | |
|---|---|---|---|---|---|
| Data MER | 1st Carrier (204MHz, 4k QAM) | 2nd Carrier (396MHz, 4k QAM) | 3rd Carrier (588MHz, 4k QAM) | 4th Carrier (786MHz, 4k QAM, 96MHz) | 5th Carrier (930MHz, 4k QAM) | 6th Carrier (1122MHz, 4k QAM) |
| Bias 440mA (3W/Amplifier) | 36.61 dB | 37.14 dB | 36.70 dB | | 36.26 dB | 36.81 dB |
| Bias 440mA No CFR DPD (3W/Amplifier) (DPD diverge) | 36.05 dB | 42.74 dB | 42.95 dB | | 43.12 dB | 42.24 dB |
| Bias 440mA CFR DPD (3W/Amplifier) | 41.64 dB | 44.30 dB | 45.0 dB | | 42.18 dB | 41.74 dB |

METHOD OF AND CIRCUIT FOR CREST FACTOR REDUCTION FOR A CABLE TV AMPLIFIER

TECHNICAL FIELD

Examples of the present disclosure generally relate to integrated circuits ("ICs") and, in particular, to an embodiment related to performing crest factor reduction for cable TV (CATV) amplifiers.

BACKGROUND

To meet the demands for higher data rates of internet, telephony, and video services, the cable industry is deploying a new high data rate and wideband Remote PHY node based on the new Data Over Cable Service Interface Specification (DOCSIS) 3.1 standards. DOCSIS 3.1 supports 4096 quadrature amplitude modulation (QAM) and uses orthogonal frequency division multiplexing (OFDM). As such, the transmitted signal quality requirement for DOCSIS 3.1 is much higher than for the current standard DOCSIS 3.0. Due to the more sophisticated functions associated with DOCSIS 3.1, cable television (CATV) amplifiers may operate in a non-linear region. The non-linear effects of a CATV amplifier will significantly degrade a transmitted signal quality. In addition, the new components that provide the high data rates and more sophisticated functions of DOCSIS 3.1 will themselves consume power. However, since the power supply to each node (e.g., each remote PHY node) is fixed, the power consumption of other components (e.g., such as the CATV amplifiers) should be reduced. Thus, while it is desirable to provide the advanced performance of DOCSIS 3.1, it has been challenging to do so while providing an improved transmitted signal quality and a reduced power consumption of other components (e.g., such as CATV amplifiers).

Accordingly, there is a need for improved methods and circuits for crest factor reduction for CATV amplifiers.

SUMMARY

In some embodiments in accordance with the present disclosure, a crest factor reduction (CFR) system includes a digital tilt filter coupled to an input of the CFR system. In some embodiments, the digital tilt filter is configured to receive a system input signal and generate a digital tilt filter output signal at a digital tilt filter output. In some examples, the CFR system further includes a CFR module coupled to the digital tilt filter output, where the CFR module is configured receive the digital tilt filter output signal and perform a CFR process to the digital tilt filter output signal to generate a CFR module output signal at a CFR module output. In addition, the CFR system may include a digital tilt equalizer coupled to the CFR module output, where the digital tilt equalizer is configured to receive the CFR module output signal and generate a system output signal.

In some embodiments, the CFR system further includes a digital predistortion (DPD) module coupled to the CFR module output, where the DPD module is configured to receive the CFR module output signal and perform a DPD process to the CFR module output signal to generate a DPD module output signal at a DPD module output. In some cases, the digital tilt equalizer is coupled to the DPD module output, and the digital tilt equalizer is configured to receive the DPD module output signal and generate the system output signal.

In some embodiments, the system input signal has a first peak-to-average power ratio (PAPR), and the CFR module output signal has a second PAPR less than the first PAPR.

In some embodiments, the CFR system further includes a first linear datapath coupled to the input of the CFR system and in parallel with the CFR module and the DPD module to generate a first time-delayed signal. In some examples, the CFR system also includes a first combiner configured to combine a digital tilt equalizer output signal and the first time-delayed signal to generate the system output signal.

In some embodiments, the CFR system further includes a second linear datapath coupled to the input of the CFR system and in parallel with the CFR module to generate a second time-delayed signal. By way of example, a second combiner is configured to combine the CFR module output signal and the second time-delayed signal to generate a first output signal, and a third combiner is configured to combine the first output signal and the DPD module output signal to generate the system output signal.

In some embodiments, the CFR system further includes a non-linear datapath coupled to the CFR module output, where the non-linear datapath includes a plurality of parallel datapath elements each coupled to the CFR module output, where each of the plurality of parallel datapath elements is configured to add a different inverse non-linear component to the CFR module output signal corresponding to a non-linear component of an amplifier, and where a combiner is configured to combine an output of each of the plurality of parallel datapath elements to generate the DPD module output signal.

In some embodiments, a digital-to-analog converter (DAC) is configured to receive the system output signal and generate a DAC output signal, where an analog tilt filter is configured to receive the DAC output signal and generate an analog tilt filter output signal, and where the digital tilt filter is configured to model the analog tilt filter.

In some embodiments, the digital tilt equalizer is configured to model an inverse of the analog tilt filter.

In some embodiments, the CFR system further includes a single side band Hilbert filter, where a single side band Hilbert filter input is configured to receive the DPD module output signal, and where a single side band Hilbert filter output is coupled to a digital tilt equalizer input.

In some embodiments, the CFR system further includes an adaptation engine configured to receive feedback data from an amplifier output, where based on the feedback data, the adaptation engine is configured to update a configuration of the CFR module.

In some embodiments in accordance with the present disclosure, a digital front-end (DFE) system is configured to perform a crest factor reduction (CFR) process, and the DFE system includes a digital upconverter (DUC) configured to receive and translate a baseband data input signal to generate a composite signal. In various embodiments, the DFE system further includes a CFR system including a digital tilt filter, a CFR module, and a digital tilt equalizer, where the digital tilt filter is configured to receive the composite signal and generate a digital tilt filter output signal, where the CFR module is configured to receive the digital tilt filter output signal and perform the CFR process to the digital tilt filter output signal to generate a CFR module output signal, where the digital tilt equalizer is configured to receive the CFR module output signal and generate a CFR system output signal, and where the CFR system output signal is coupled to an amplifier. In some examples, the DFE system further includes an adaptation engine configured to receive feedback data from an output of the amplifier, where based on the feedback data, the adaptation engine is configured to update a configuration of the CFR system.

In some embodiments, the CFR process is configured to reduce a peak-to-average power ratio (PAPR) of the digital tilt filter output signal.

In some embodiments, the CFR system further includes a digital predistortion (DPD) module including a non-linear datapath coupled to a CFR module output, where the non-linear datapath includes a plurality of parallel datapath elements each coupled to the CFR module output, where each of the plurality of parallel datapath elements is configured to model a different inverse non-linear component corresponding to a non-linear component of the amplifier, where a combiner is configured to combine an output of each of the plurality of parallel datapath elements to generate a DPD module output signal, and where the digital tilt equalizer is configured to receive the DPD module output signal and generate the CFR system output signal.

In some embodiments, a digital-to-analog converter (DAC) is configured to receive the CFR system output signal and generate a DAC output signal, where an analog tilt filter is configured to receive the DAC output signal and generate an analog tilt filter output signal, and where the digital tilt filter is configured to model the analog tilt filter.

In some embodiments, the digital tilt equalizer is configured to model an inverse of the analog tilt filter.

In some embodiments in accordance with the present disclosure, a method includes receiving, at a digital tilt filter of a crest factor reduction (CFR) system, an input signal and generating a digital tilt filter output signal at a digital tilt filter output. In various examples, the method further includes performing, at a CFR module of the CFR system, a CFR process to the digital tilt filter output signal to generate a CFR module output signal, where the CFR process is configured to reduce a peak-to-average power ratio (PAPR) of the digital tilt filter output signal. In some examples, the method further includes receiving, at a digital tilt equalizer of the CFR system, the CFR module output signal and generating a system output signal. In some embodiments, the method further includes providing the system output signal to an amplifier.

In some embodiments, the method further includes responsive to feedback data received from an output of the amplifier, updating a configuration of the CFR system.

In some embodiments, the method further includes performing, at a digital predistortion (DPD) module of the CFR system, a DPD process to the CFR module output signal to generate a DPD module output signal. In some examples, the method further includes receiving, at the digital tilt equalizer of the CFR system, the DPD module output signal and generating the system output signal.

In some embodiments, the DPD module further includes a non-linear datapath coupled to an output of the CFR module, where the non-linear datapath includes a plurality of parallel datapath elements each coupled to the CFR module output, where each of the plurality of parallel datapath elements is configured to model a different inverse non-linear component corresponding to a non-linear component of the amplifier, and where a combiner is configured to combine an output of each of the plurality of parallel datapath elements to generate the DPD module output signal.

In some embodiments, the method further includes responsive to providing the system output signal to the amplifier and while operating the amplifier in a non-linear region, reducing a power consumption of the amplifier.

Other aspects and features will be evident from reading the following detailed description and accompanying drawings.

BRIEF DESCRIPTION OF THE DRAWINGS

FIGS. 5A and 5B provide an exemplary DPD-CFR input spectrum and DPD-CFR output spectrum, respectively, in accordance with some embodiments.

FIGS. 7A, 7B, and 7C provide exemplary plots showing a normalized magnitude of a CATV amplifier output sampled over time, and showing the effect of performing a CFR process, in accordance with some embodiments.

FIG. 8B illustrates a power spectrum for which a CFR process has been performed and corresponding to the data of FIG. 8A, according to some embodiments.

FIG. 11 provides a table including modulation error ratio (MER) data for a CATV amplifier showing the effect of applying the corrections provided by the DPD-CFR system on the MER data, according to some embodiments.

DETAILED DESCRIPTION

Figure 1:
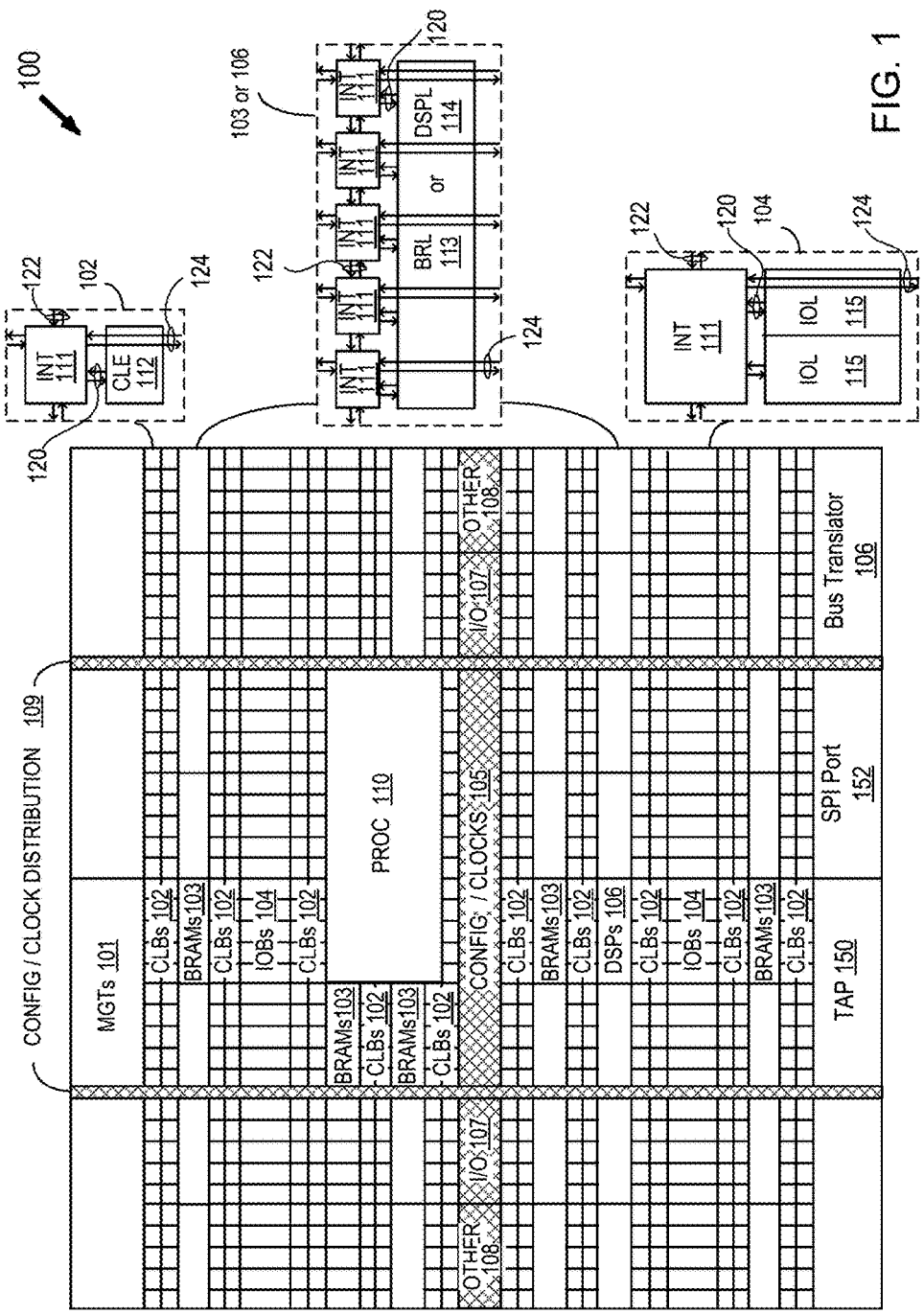
FIG. 1 is a block diagram illustrating an exemplary architecture for an IC, according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding.

As discussed above, the cable industry is deploying a new high data rate and wideband Remote PHY node based on the DOCSIS 3.1 standards to meet the demands for higher data rates of internet, telephony, and video services. DOCSIS 3.1 supports 4096 (4K) quadrature amplitude modulation (QAM) and uses orthogonal frequency division multiplexing (OFDM). As such, the transmitted signal quality requirement for DOCSIS 3.1 is much higher than for the current standard DOCSIS 3.0. Due to the more sophisticated functions associated with DOCSIS 3.1, cable television (CATV) amplifiers may operate in a non-linear region. The non-linear effects of a CATV amplifier will significantly degrade a transmitted signal quality. In addition, the new components that provide the high data rates and more sophisticated functions of DOCSIS 3.1 will themselves consume power. However, since the power supply to each node (e.g., each remote PHY node) is fixed, the power consumption of other components (e.g., such as the CATV amplifiers) should be reduced. Thus, while it is desirable to provide the advanced performance of DOCSIS 3.1, it has been challenging to do so while providing an improved transmitted signal quality and a reduced power consumption of other components (e.g., such as CATV amplifiers).

In at least some existing techniques, a tilt equalizer (tilt filter) with deep attenuation up to 22 dB over the 1.2 GHz cable spectrum is implemented in an analog transmit path to compensate for coaxial cable loss (e.g., from CATV amplifier to cable modem). However, a DOCSIS 3.1 waveform using 4K QAM OFDM modulation shows a high peak-to-average power ratio (PAPR) as compared to the current DOCSIS 3.0 standard. As such, for the same RMS power output of a CATV amplifier in DOCSIS 3.0, the peak of a DOCSIS 3.1 waveform will be in the non-linear region of the CATV amplifier. Thus, transmitted signal quality is degraded. Digital predistortion (DPD) can be used to improve the signal quality for a CATV amplifier, for example, by causing the CATV to operate in a higher efficiency region. DPD has been used for wireless communication technologies where signal bandwidth is much more narrow than that used for cable communication technologies. Further, in wireless communications, harmonics of the non-linear effects of the wireless components do not fall into the signal bandwidth. As such, DPD for wireless communications need only model the non-linear components projected around the baseband frequency. However, for cable applications, harmonics of the non-linear effects of the CATV amplifier signal fall into the signal bandwidth. Therefore, DPD implementations for cable applications should model the harmonic components of the non-linear effects for the CATV amplifier. Separately, the tilt equalizer with deep attenuation cannot be implemented in the digital domain, and a digital tilt equalizer implementation will degrade the transmitting waveform quality of lower frequency carriers due to the finite digital resolution of a digital-to-analog converter (DAC).

In addition, as noted above, a DOCSIS 3.1 waveform using 4K QAM OFDM modulation shows a high PAPR as compared to the current DOCSIS 3.0 standard. Some of the effects of a high PAPR include in-band distortion and out-of-band distortion (e.g., including increased adjacent channel leakage ratio (ACLR). Crest factor reduction (CFR) can be used to reduce a signal's PAPR by clipping the signal and allowing for additional gain at a CFR output. Clipping works by intentionally limiting a signal, so that the amplitude is limited to a maximum value within a desired range. By employing CFR, it is possible to operate an amplifier (e.g., a CATV amplifier) closer to its 1-dB compression point, which increases the efficiency of the CATV amplifier. Moreover, when combined with DPD, CFR can be used to significantly improve DPD stability (e.g., and avoid DPD divergence) and further increase CATV amplifier efficiency. For integrated circuit (IC) solutions, it has been discovered that CFR and DPD data paths, implemented within a digital front-end (DFE) chip, can provide a solution to the high PAPR of DOCSIS 3.1 waveforms, DPD stability, and CATV amplifier efficiency, as well as providing for modeling the harmonic components of the non-linear effects for the CATV amplifier and the deep attenuation over the transmitting spectrum in CATV amplifiers. Thus, embodiments of the present disclosure provide for improved transmitted signal quality, increased CATV amplifier efficiency, and reduced power consumption of the CATV amplifiers.

With the above general understanding borne in mind, various embodiments for providing methods and circuits for CFR for CATV amplifiers are generally described below. Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110. In some embodiments, the FPGA architecture 100 includes an RF data converter subsystem, which contains multiple radio frequency analog-to-digital converters (RF-ADCs) and multiple radio frequency digital-to-analog converters (RF-DACs). In various examples, the RF-ADCs and RF-DACs may be individually configured for real data or can be configured in pairs for real and imaginary I/Q data. In at least some examples, the FPGA architecture 100 may implement an RFSoC device.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the methods and circuits for CFR for CATV amplifiers is not limited to the exemplary IC depicted in FIG. 1, and that ICs having other configurations, or other types of ICs, may also implement the methods and circuits for CFR for CATV amplifiers.

Figure 2:
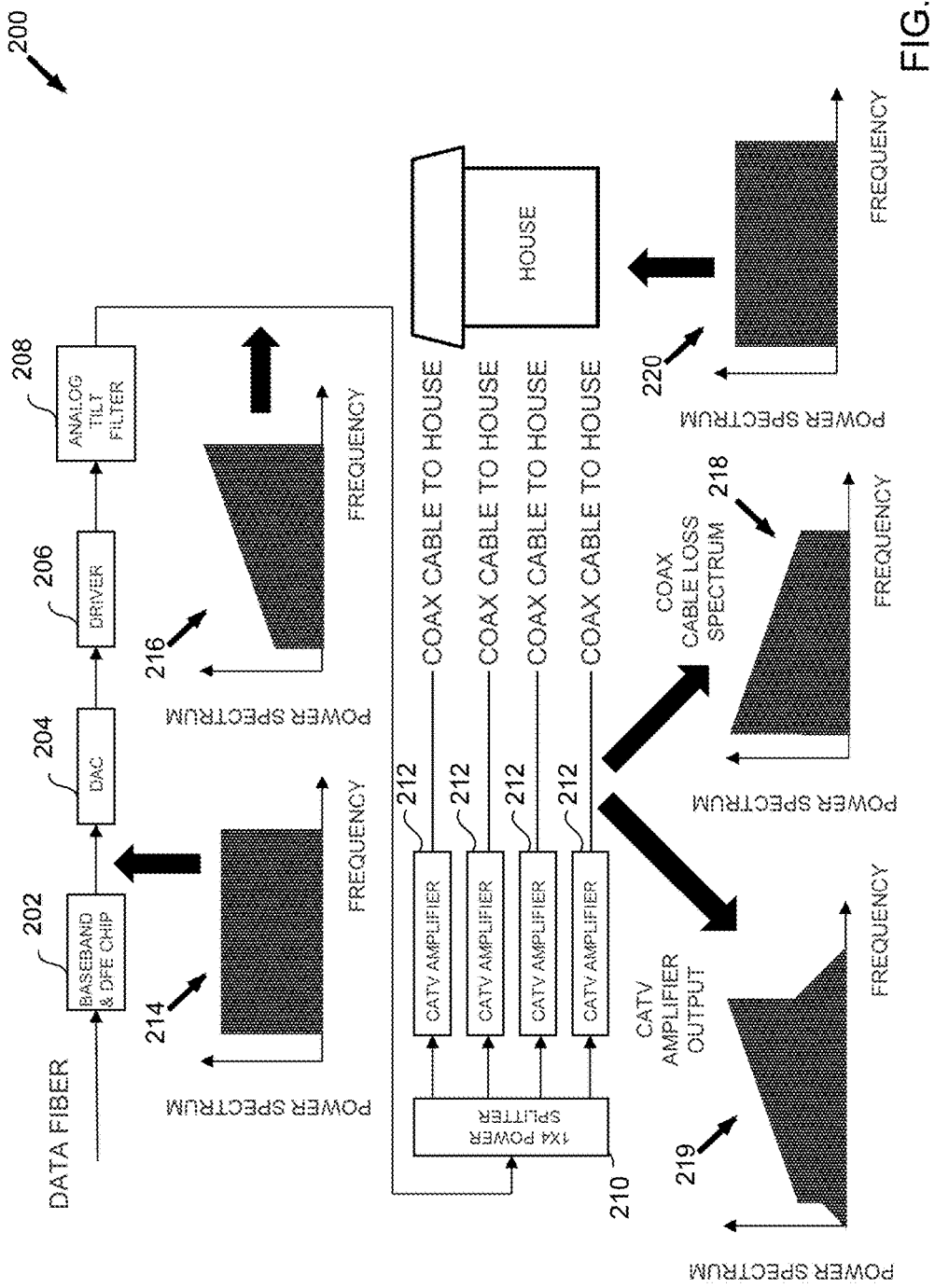
FIG. 2 is a schematic diagram of an exemplary cable network, in accordance with some embodiments.

With reference now to FIG. 2, illustrated therein is a cable network 200 that shows a signal path starting from a data fiber (e.g., which may include an optical fiber), through a remote node, and to an end user location (e.g., at a house). The cable network 200 may be part of a hybrid fiber-coaxial network, where a data fiber is run from a central headend to the remote node, and where coaxial cable is run from the remote node to the end user. In some examples, the remote node includes a remote PHY node based on the DOCSIS 3.1 standards. The remote PHY node, in some embodiments, may include a baseband and digital front-end (DFE) chip 202, a digital-to-analog converter (DAC) 204, a driver 206 (e.g., which may include an amplifier), an analog tilt filter 208, a power splitter 210, and CATV amplifiers 212. In various examples, the baseband and DFE chip 202 may be implemented as a single chip, or as separate chips including a baseband processor chip and a separate DFE chip. In some embodiments, the DAC 204 may be implemented as an RF DAC or an IF DAC, for example, depending on an input to the DAC 204. Additionally, in some embodiments, the baseband and DFE chip 202 and the DAC 204 may be implemented as a single chip (e.g., as in an RFSoC device). Moreover, one or more components of the remote PHY node may be implemented in a programmable logic device, such as the programmable logic device of FIG. 1. As shown in FIG. 2, the data fiber is connected as an input to the baseband and DFE chip 202, the output of the baseband and DFE chip 202 is connected as an input to the DAC 204. A power spectrum 214 (without a slope) provides an example of the shape of the signal at the output of the baseband and DFE chip 202. The output of the DAC 204 is connected as an input to the driver 206, and the output of the driver 206 is connected as an input to the analog tilt filter 208. For cable applications, the analog tilt filter 208 may be used to change a gain across the power spectrum of the signal. Stated another way, the analog tilt filter 208 is used to add a slope in the power levels of the signal across the power spectrum. A power spectrum 216 illustrates the slope (e.g., a positive slope in the present example) in the signal, as compared to the power spectrum 214, at the output of the analog tilt filter 208.

In some embodiments, the output of the analog tilt filter 208 is connected as an input to the power splitter 210. In the example of FIG. 2, the power splitter 210 includes a 1×4 power splitter having a single input and four outputs. However, in some embodiments, the power splitter 210 may include a 1×2 power splitter having a single input and two outputs, a cascade of 1×2 power splitters (e.g., to produce four outputs), or another type of power splitter. In the present example, each of the four outputs of the power splitter 210 is connected as an input to a CATV amplifier 212. The output of each of the CATV amplifiers 212 is then coupled to a coaxial cable which is further coupled to a cable modem at the end user location (e.g., at a house). In at least some embodiments, the cable network 200 implements a Node+0 architecture, which means there are no additional CATV amplifiers (beyond the CATV amplifiers 212 at the remote PHY node) along the coaxial cable path between the remote PHY node and the end user location. FIG. 2 further illustrates a power spectrum 218 showing a coaxial cable loss spectrum (e.g., with a negative slope), a power spectrum 219 showing an output signal of the CATV amplifiers 212, and a power spectrum 220 showing a power spectrum (without a slope) of a signal reaching the end user location. As previously discussed, the analog tilt filter 208 is used to compensate for coaxial cable loss (e.g., from the CATV amplifiers 212 to the cable modem at the end user location).

In at least some existing cable networks, CATV amplifiers operate in a linear region. This means that an amount of non-linearity at an output of a CATV amplifier is low enough that no additional signal processing is needed, and the signal at the output of the CATV amplifier may be sent directly on a coaxial cable to an end user location cable modem for demodulation and information transfer. However, with the transition to the more sophisticated functions and additional power-consuming components associated with DOCSIS 3.1, and because the power supply to each node (e.g., each remote PHY node) is fixed, it would be desirable to reduce the power consumption of other components such as the CATV amplifiers. Currently, CATV amplifiers are around 2-3% efficient, so for example, a single CATV amplifier with 20 Watts of input power would output around ½ Watt of output power. For four CATV amplifiers (e.g., as shown in FIG. 2), 100 Watts of input power would output around 2 Watts of output power. Thus, it is highly desirable to make CATV amplifiers more efficient.

At least one option that is being explored to make CATV amplifiers more efficient is to make the CATV amplifiers operate in a more non-linear region. However, doing so means that the signal at the output of the CATV amplifier may not be sent directly on a coaxial cable to an end user location without some sort of additional digital signal processing, as provided in accordance with embodiments of the present disclosure. For example, embodiments disclosed herein add functionality within the baseband and DFE chip 202, as discussed in more detail below, so that even if the CATV amplifiers operate in a non-linear region, the baseband and DFE chip 202 will be able to invert or change the signal such that the signal at the output of the CATV amplifier will still be linear and can be readily demodulated by a cable modem at the end user location. Stated another way, if a CATV amplifier has a non-linearity 'x', the functionality within the baseband and DFE chip 202 is configured to add inverse non-linearity '1/x' that will be cancelled out by the non-linearity 'x' of the CATV amplifier. As such, the signal at the output of the CATV amplifier is clean and linear. Generally, the process of adding in the non-linearity in advance (e.g., such as adding in the inverse non-linearity at the baseband and DFE chip 202) is called predistorting or predistortion. In the context of the baseband and DFE chip 202, and since distortion is added digitally, the predistortion may be referred to as digital predistortion (DPD). In accordance with various embodiments, the DPD process is performed with the knowledge of the type of non-linearity 'x' that a CATV amplifier (e.g., such as the CATV amplifiers 212) has, so that the DPD process may add the proper inverse non-linearity '1/x'. Thus, the DPD process is a first functionality added within the baseband and DFE chip 202, according to embodiments of the present disclosure.

In addition, a second functionality added within the baseband and DFE chip 202 may include a CFR process. As discussed above, a CFR process may be used to reduce a signal's PAPR by clipping the signal and allowing for additional gain at a CFR output. By employing CFR, it is possible to operate a CATV amplifier closer to its 1-dB compression point, which increases the efficiency of the CATV amplifier. Further, when combined with a DPD process, a CFR process can be used to significantly improve DPD stability (e.g., and avoid DPD divergence) and further increase CATV amplifier efficiency. In various embodiments, the DPD process and the CFR process are performed with the knowledge of the signal chain between the baseband and DFE chip 202 and the CATV amplifiers 212, including any effects and/or distortions introduced by each of the DAC 204, the driver 206, and the analog tilt filter 208. In various embodiments, by the DPD process and CFR process disclosed herein, CATV amplifier efficiency is improved and power consumption is reduced.

Figure 3:
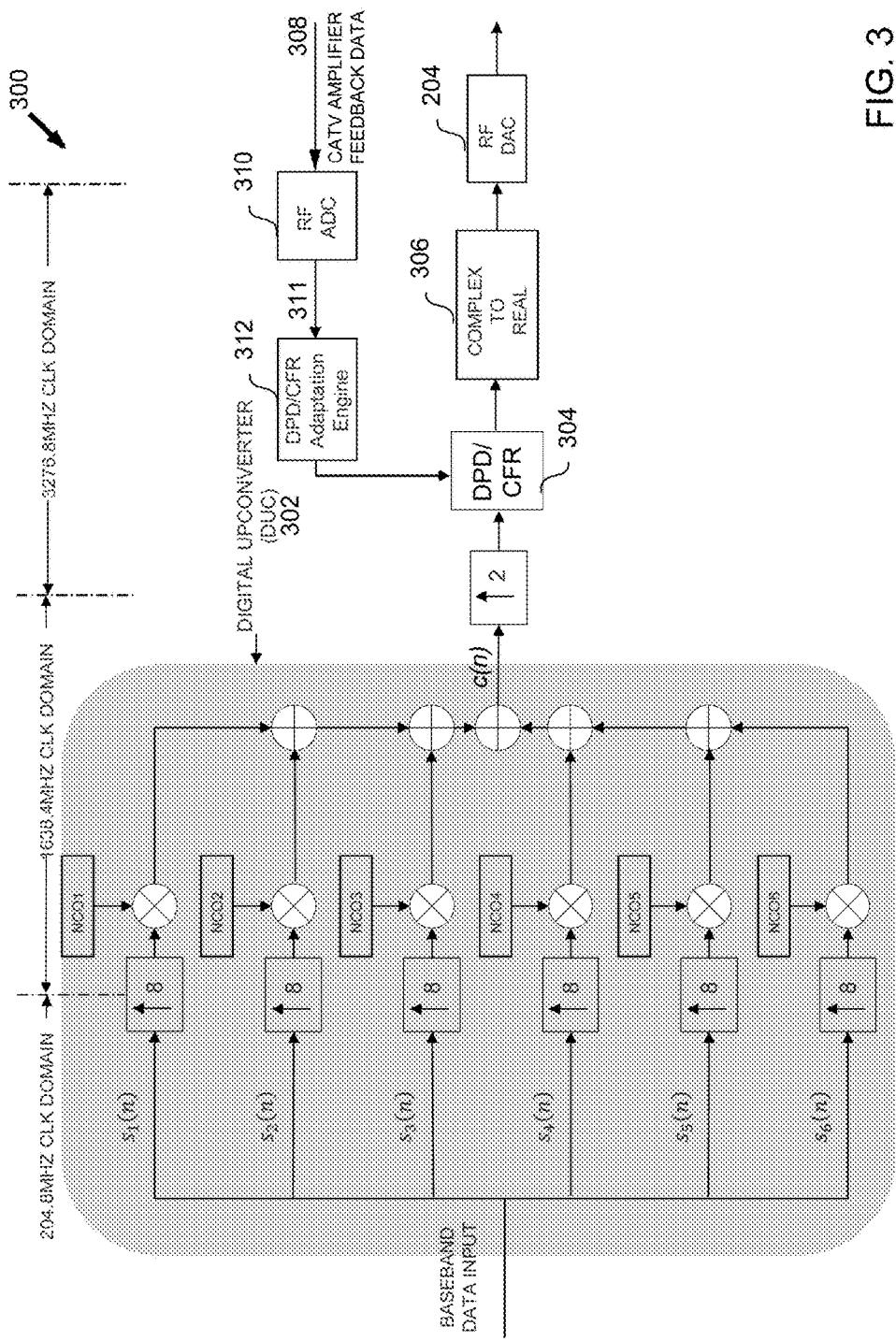
FIG. 3 is a schematic diagram of an exemplary digital front-end (DFE) system, in accordance with some embodiments.

In some embodiments, the functionality within the baseband and DFE chip 202 (e.g., including the DPD process and the CFR process) may be implemented largely as DFE functionality, where a baseband output signal is provided as an input to the DFE chip. As such, and with reference now to FIG. 3, illustrated therein is a DFE system 300 that provides a DFE design configured to carry out one or more aspects of the present disclosure. In some embodiments, the DFE system 300 includes a digital upconverter (DUC) 302. In various examples, the DUC 302 is used to translate one or more channels of data from baseband to a passband signal comprising modulated carriers at a set of one or more specified radio or intermediate frequencies (RF or IF). By way of example, the DUC 302 achieves this by performing interpolation (e.g., to increase the sample rate), filtering (e.g., to provide spectral shaping and rejection of interpolation images), and mixing (e.g., to shift the signal spectrum to the desired carrier frequencies). Generally, the sample rate at the input to the DUC 302 is relatively low; for example, the symbol rate of a digital communications system, while the output is a much higher rate, for example the input sample rate to a DAC, which converts the digital samples to an analog waveform for further analog processing and frequency conversion.

As shown in the example of FIG. 3, a baseband data input is provided to the DUC 302. The baseband data input includes a plurality of different carriers represented as $s_1(n)$, $s_2(n)$, $s_3(n)$, $s_4(n)$, $s_5(n)$, and $s_6(n)$. In some embodiments, the sampling rate of the baseband data input is around 204.8 MHz, corresponding to the OFDM symbol clock. By way of example, the DUC 302 generates the plurality of different carriers (e.g., from the baseband data input) by initially performing interpolation of the baseband data input, which in the present example is used to increase the sampling rate by a factor of eight (8), and thereby transition from a first clock domain (e.g., a 204.8 MHz clock domain) to a second clock domain (e.g., a 1638.4 MHz clock domain). After the interpolation process, each of the plurality of different carriers is mixed with a signal from a numerically controlled oscillator (NCO), each NCO having a different frequency, to shift the frequency of each of the plurality of different carriers to a desired carrier frequency. For example, the carrier $s_1(n)$ is mixed with a first NCO (NCO1) having a first frequency, the carrier $s_2(n)$ is mixed with a second NCO (NCO2) having a second frequency, the carrier $s_3(n)$ is mixed with a third NCO (NCO3) having a third frequency, the carrier $s_4(n)$ is mixed with a fourth NCO (NCO4) having a fourth frequency, the carrier $s_5(n)$ is mixed with a fifth NCO (NCO5) having a fifth frequency, and the carrier $s_6(n)$ is mixed with a sixth NCO (NCO6) having a sixth frequency. After the mixing process, each of the plurality of different carriers are combined to form a composite signal $c(n)$. Thus, the composite signal $c(n)$ includes each of the plurality of different carriers mixed at different frequencies. In some embodiments, and as a result of the mixing process, the composite signal $c(n)$ may look substantially the same as the signal shown in FIG. 5A, where each of the plurality of different carriers are arranged side-by-side in frequency. In some cases, after generation of the composite signal $c(n)$, another interpolation process may be optionally performed, which in the example of FIG. 3 is used to increase the sampling rate of the composite signal $c(n)$ by a factor of two (2), and thereby transition from the second clock domain (e.g., a 1638.4 MHz clock domain) to a third clock domain (e.g., a 3276.8 MHz clock domain). After signal processing by the DUC 302, the composite signal $c(n)$ is provided as an input to a DPD-CFR system 304, which is described in more detail below. In some embodiments, the output of the DPD-CFR system 304 may undergo complex-to-real signal conversion 306, with the output of the complex-to-real signal conversion 306 provided as input to a DAC (e.g., which may be the DAC 204 of FIG. 2). In addition, one or more components of the DFE system 300 may be implemented in a programmable logic device, such as the programmable logic device of FIG. 1.

As previously discussed, the DPD and CFR processes, and thus the DPD-CFR system 304, function with the knowledge of the type of non-linearity 'x' that the CATV amplifier has, and with the knowledge of the signal chain between the baseband and DFE chip 202 and the CATV amplifiers 212, so that the DPD-CFR system 304 may effectively implement appropriate DPD and CFR processes (e.g., including adding the proper inverse non-linearity '1/x' and reducing a signal's PAPR). For example, the DPD-CFR system 304 may be used to model the CATV amplifier (e.g., including non-linear effects and the signal chain). As such, the models provided by the DPD-CFR system 304 may be generated and/or updated based on feedback data 308, where the feedback data 308 may include an output signal of a CATV amplifier (e.g., such as the CATV amplifier 212). In some embodiments, the feedback data 308 is processed through an analog-to-digital converter (ADC) 310 and provided to a DPD/CFR adaptation engine 312 as digital feedback data 311. In various examples, and based on the digital feedback data 311, the DPD/CFR adaptation engine 312 updates the DPD-CFR system 304 so that the DPD-CFR system 304 may adapt to the runtime behavior of the CATV amplifier. More specifically, in some embodiments, the DPD/CFR adaptation engine 312 may determine coefficients of filters or configuration of other elements within the DPD-CFR system 304, and generally may configure CFR and DPD modules, discussed below, within the DPD-CFR system 304. Thus, by continuously monitoring and updating the models provided by the DPD-CFR system 304 (e.g., via the feedback data 308 and the DPD/CFR adaptation engine 312), optimal DPD and CFR processes may be implemented. By way of example, aspects of monitoring and updating the models (e.g., such as functionality of the DPD/CFR adaptation engine 312) may be implemented as software stored in memory (e.g., within BRAMs 103, or within another on-chip memory location) and executed by one or more on-chip processors (e.g., PROC 110). It is noted that in some embodiments, the baseband and DFE chip 202, the DAC 204, and the ADC 310 may be implemented as a single chip (e.g., as in an RFSoC device). The example of monitoring and updating the models provided above is not meant to be limiting in any way, and it will be understood that while other methods are possible, the embodiments of the present disclosure are not limited by any of the examples provided.

Figure 4A:
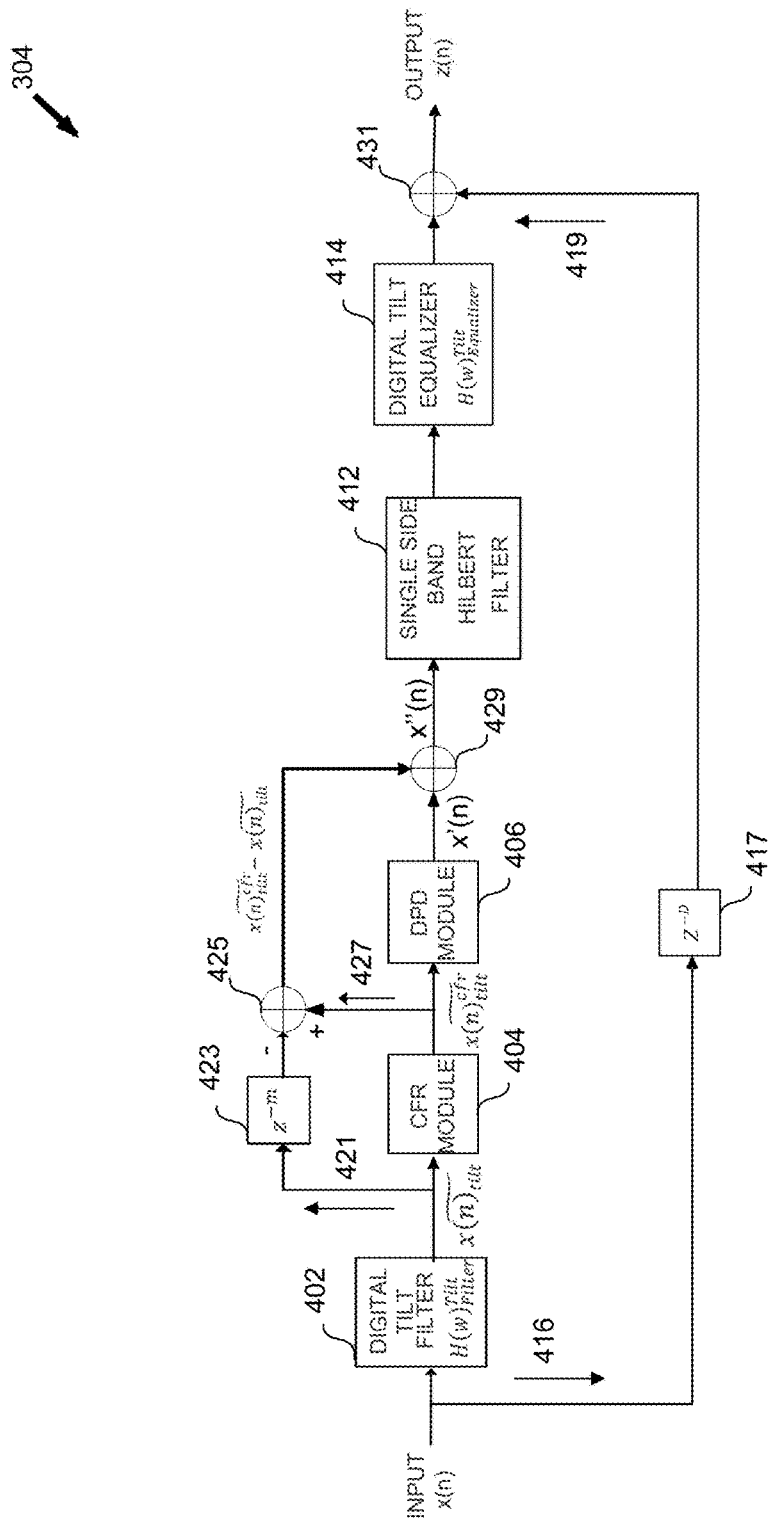
FIG. 4A provides a diagram of a digital predistortion (DPD)-crest factor reduction (CFR) system, according to some embodiments.

With reference now to FIG. 4A, illustrated therein is a more detailed view of the DPD-CFR system 304, described above, that is used to implement various aspects of the present disclosure. As shown, the DPD-CFR system 304 may include a digital tilt filter 402, a CFR module 404, a DPD module 406, a single side band Hilbert filter 412, and a digital tilt equalizer 414. It is noted that one or more components of the DPD-CFR system 304 may be implemented in a programmable logic device, such as the programmable logic device of FIG. 1.

Still with reference to FIG. 4A, the functionality of the DPD-CFR system 304 is described in more detail. For example, in some embodiments, an input signal x(n), which may include the composite signal c(n) discussed above, is provided to the digital tilt filter 402. In various cases, the digital tilt filter 402 may be used to model the analog tilt filter 208 (FIG. 2). Thus, by way of example, the output of the digital tilt filter 402 may be similar to the output of the analog tilt filter 208. In some embodiments, the output of the digital tilt filter 402, noted as $\widetilde{x(n)}_{tilt}$, is provided as an input to the CFR module 404. In various embodiments, the CFR module 404 may perform a CFR process to reduce the PAPR of the incoming signal (e.g., the output of the digital tilt filter 402, $\widetilde{x(n)}_{tilt}$). While the present embodiments are not limited to any particular CFR technique employed by the CFR module 404, exemplary CFR techniques may include: adaptive baseband, intermediate frequency (IF) clipping and filtering, peak windowing, or another appropriate technique. After the CFR process, the CFR module 404 provides an output, noted as $\widetilde{x(n)}_{tilt}^{cfr}$, to the DPD module 406. As shown, the output of the digital tilt filter 402 ($\widetilde{x(n)}_{tilt}$) is also provided along a datapath 421 where a time delay is introduced in the signal $\widetilde{x(n)}_{tilt}$ (e.g., at block 423). By way of example, the output of the CFR module 404 ($\widetilde{x(n)}_{tilt}^{cfr}$) is further provided along a datapath 427, and a combiner 425 is then used to combine the output of the CFR module 404 ($\widetilde{x(n)}_{tilt}^{cfr}$) with the time-delayed signal $\widetilde{x(n)}_{tilt}$, resulting in a signal $\widetilde{x(n)}_{tilt}^{cfr}$ - $\widetilde{x(n)}_{tilt}$.

Figure 4B:
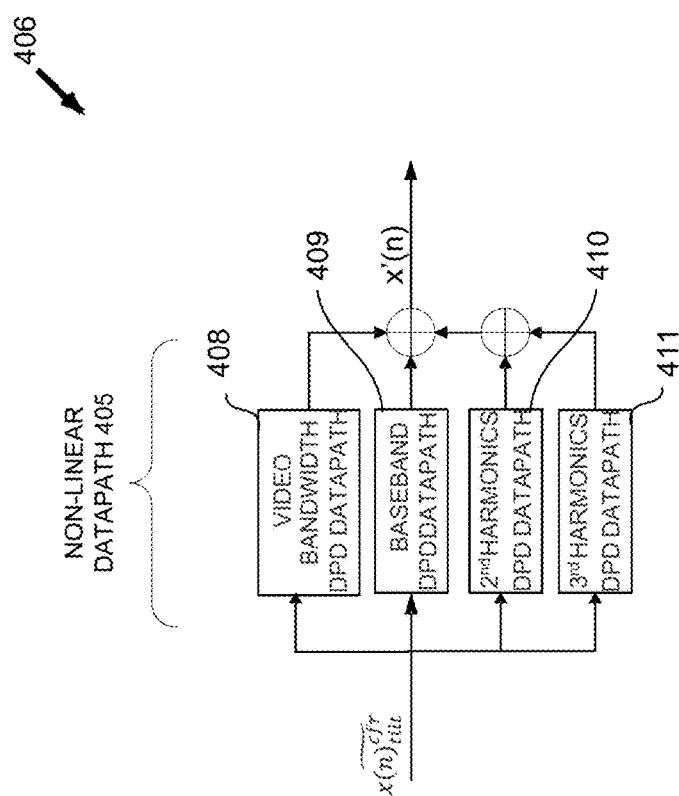
FIG. 4B provides an example of a DPD module, according to some embodiments.

In some embodiments, the DPD module 406 is used to model and add inverse baseband, video, and harmonic components of the CATV amplifier to the incoming signal $\widetilde{x(n)}_{tilt}^{cfr}$. Referring to FIG. 4B, illustrated therein is a more detailed view of the DPD module 406. As shown, the output of the CFR module 404 ($\widetilde{x(n)}_{tilt}^{cfr}$) is provided as an input to the DPD module 406, which includes a non-linear datapath 405. In various embodiments, the non-linear datapath 405 includes a plurality of different parallel datapath elements including a video bandwidth DPD datapath 408, a baseband DPD datapath 409, a $2^{nd}$ harmonics DPD datapath 410, and a $3^{rd}$ harmonics DPD datapath 411. In general, the non-linear datapath 405 is used to model and add the inverse non-linear behavior of the CATV amplifier to the incoming signal. More particularly, each of the different parallel datapath elements of the non-linear datapath 405 are used to model and add a different aspect of the inverse non-linear behavior of the CATV amplifier to the incoming signal (e.g., the output of the CFR module 404 ($\widetilde{x(n)}_{tilt}^{cfr}$) For example, the video bandwidth DPD datapath 408 may model and add an inverse non-linear video bandwidth component, the baseband DPD datapath 409 may model and add an inverse non-linear baseband component, the $2^{nd}$ harmonics DPD datapath 410 may model and add an inverse $2^{nd}$ harmonics component, and the $3^{rd}$ harmonics DPD datapath 411 may model and add an inverse $3^{rd}$ harmonics component. As shown, the output of each of the video bandwidth DPD datapath 408, the baseband DPD datapath 409, the $2^{nd}$ harmonics DPD datapath 410, and the $3^{rd}$ harmonics DPD datapath 411 are then combined to provide a composite signal x'(n) that models the baseband, video, and harmonic components of the CATV amplifier.

Returning to FIG. 4A, the output of the non-linear datapath 405 (e.g., the composite signal x'(n)) and the signal $\widetilde{x(n)}_{tilt}^{cfr}$ - $\widetilde{x(n)}_{tilt}$ are combined by a combiner 429, resulting in a signal x"(n). Thereafter, the signal x"(n) is provided as an input to the single side band Hilbert filter 412, which may be used to further modulate the signal x'(n)), and the output of the single side band Hilbert filter 412 is provided as an input to the digital tilt equalizer 414. By way of example, the digital tilt equalizer 414 may be used to model and add the inverse of the analog tilt filter 208 (FIG. 2) to the incoming signal. Thus, by way of example, the output of the digital tilt equalizer 414 may not be affected by (e.g., or may cancel) the effect of the analog tilt filter 208. As shown in FIG. 4A, in some embodiments, the input signal x(n) is also transmitted along a path 416, where the path 416 is a linear datapath. In some examples, the datapath 416 may merely introduce a time delay in the input signal x(n) (e.g., at block 417). Moreover, the input signal x(n) transmitted along the datapath 416 bypasses the digital tilt filter 402, the CFR module 404, the DPD module 406, the single side band Hilbert filter 412 and the digital tilt equalizer 414. As such, the quality of the signal modulation of the input signal x(n) transmitted along the datapath 416 will remain unaffected by the other elements of the DPD-CFR system 304. In addition, as shown in FIG. 4A, the output of the digital tilt equalizer 414 and the time-delayed input signal x(n) 419 are combined by a combiner 431 to provide an output signal z(n). Referring to FIGS. 2, 3, and 4A, the output of the DPD-CFR system 304, z(n), may be further processed by the RF DAC 204 and the analog tilt filter 208, resulting in a signal y(n). By way of example, the signal y(n) may be calculated as:

$$y(n) = z(n) * ATF = \{x(n) + [x(n)_{tilt}^{cfr} - x(n)_{tilt}] * DTE\} * ATF$$
$$= x(n) * ATF + [x(n)_{tilt}^{cfr} - x(n)_{tilt}] * DTE * ATF$$
$$= x(n)_{tilt} + x(n)_{tilt}^{cfr} - x(n)_{tilt}$$
$$= [x(n)_{tilt} - x(n)_{tilt}] + x(n)_{tilt}^{cfr}$$
$$\cong x(n)_{tilt}^{cfr}$$

where ATF=analog tilt filter, DTE=digital tilt equalizer, the symbol '*' is used to represent a mathematical convolution operation, and DTE*ATF=1 (unity transfer function).

Referring to FIG. 5A, an exemplary input spectrum 502 is provided. In some embodiments, the input signal x(n) (FIG. 4A) may include the input spectrum 502. As noted above, the input spectrum 502 may include each of a plurality of different carriers mixed at different frequencies (e.g., by the DUC 302), as previously described, where each of the plurality of different carriers are arranged side-by-side in frequency across a full-bandwidth from about 66 MHz to about 1218 MHz. Referring to FIG. 5B, an exemplary output spectrum 504 is provided. In some embodiments, the output signal z(n) (FIG. 4A) may include the output spectrum 504. As shown in FIG. 5B, the output spectrum 504 includes one or more non-linear components 506 that have been added to the signal by the DPD-CFR system 304. As a result of processing performed by the DPD-CFR system 304, CATV amplifier efficiency and signal quality are improved, and power consumption is reduced.

Figure 6A:
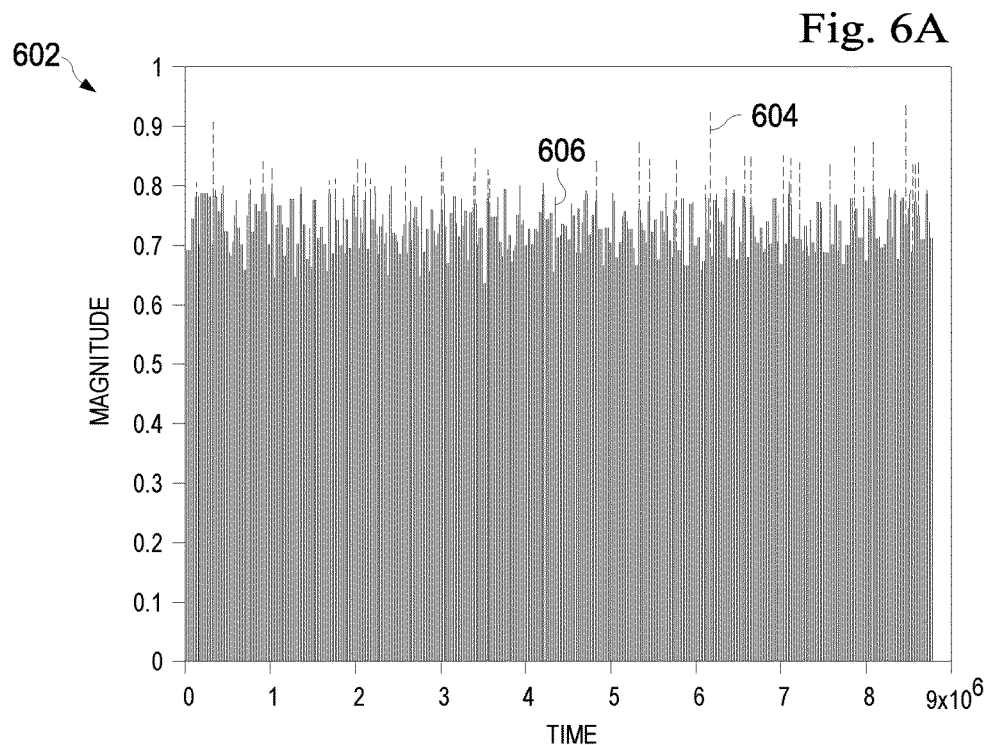
FIG. 6A provides an exemplary plot showing a normalized magnitude of an analog tilt filter output sampled over time, and showing the effect of performing a CFR process, in accordance with some embodiments.
Figure 6B:
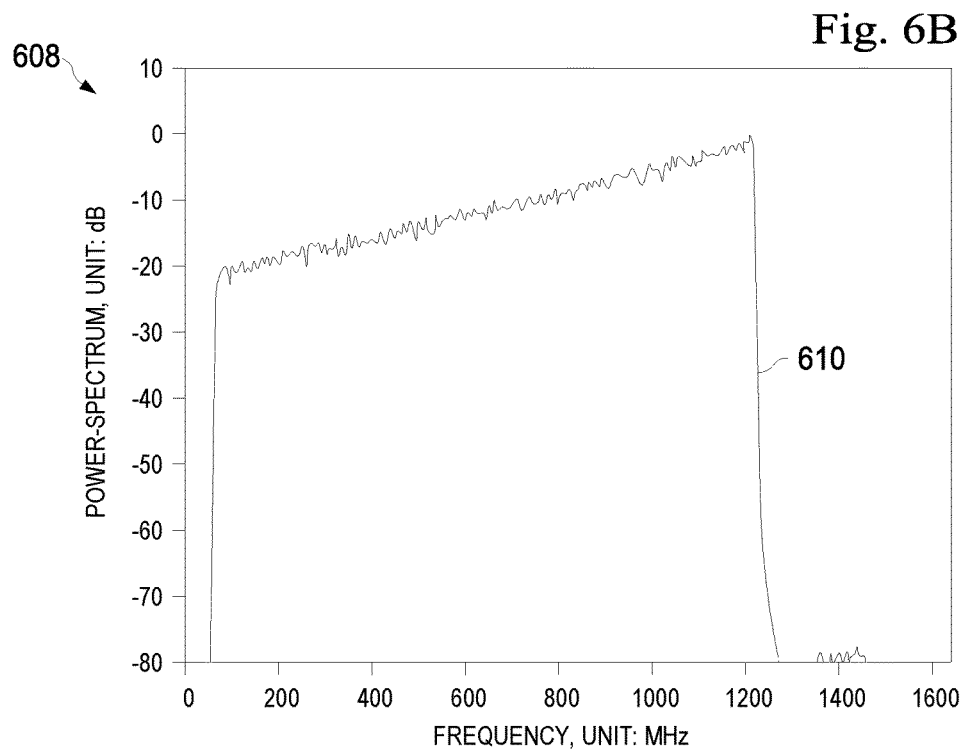
FIG. 6B illustrates a power spectrum at the output of an analog tilt filter, after performing a CFR process, according to some embodiments.

With reference now to FIGS. 6A, 6B, 7A, 7B, 7C, 8A, 8B, 9A, 9B, 10A, 10B, and 11, shown therein is a plurality of data that illustrates at least some of the benefits and advantages of the various embodiments of the present disclosure. Referring first to FIG. 6A, illustrated therein is a plot 602 showing a normalized magnitude of a tilt filter output (e.g., such as the analog tilt filter 208) sampled over time. The plot 602 includes a first dataset 604 where a CFR process was not performed. As such, the first dataset 604 exhibits large peaks (e.g., greater than about 0.78) which may result in more non-linearity in a CATV amplifier. The plot 602 also includes a second dataset 606 where a CFR process was performed and which shows reduced peak magnitudes (e.g., less than about 0.78). Thus, the reduced peaks provided by the CFR process results in an increased efficiency of the CATV amplifier. Further, the CFR process can be performed without sacrificing modulation error ratio (MER) performance. FIG. 6B provides a plot 608 that illustrates a power spectrum 610 (e.g., at the output of the analog tilt filter 208) for which the CFR process has been performed, illustrating the benefit of the reduced peak magnitudes provided by the CFR process. It is noted that the data shown in FIGS. 6A and 6B includes simulated data, where the analog tilt filter 208 has been replaced with a digital model for simulation purposes.

Referring to FIGS. 7A, 7B, and 7C, illustrated therein are plots 702, 708, 714 that show a normalized magnitude of an amplifier output (e.g., such as the CATV amplifier 212) sampled over time. Generally, the data of plots 702, 708, 714 provide verification of an efficacy of a CFR process and may include snapshots of feedback data (e.g., such as the feedback data 308). As noted above, such feedback data may include an output signal of a CATV amplifier which the DPD/CFR adaptation engine 312 may use to update models within the DPD-CFR system 304 so that the DPD-CFR system 304 may adapt to the runtime behavior of the CATV amplifier. In some cases, the data of plots 702, 708, 714 may provide snapshots of feedback data at different CATV amplifiers, in order to observe and adapt the system in real-time (e.g., via the DPD-CFR system 304) so as to provide consistency across the different CATV amplifiers. Alternatively, in some examples, the data of plots 702, 708, 714 may provide snapshots of feedback data at a particular CATV amplifier, at different windows of time, so as to observe performance of the particular CATV amplifier over time. Referring now to FIG. 7A, the plot 702 includes a first dataset where a CFR process was not performed, which includes a peak 704 (e.g., having a magnitude greater than about 0.78), and which may indicate more non-linearity in the CATV amplifier. The plot 702 also includes a second dataset 706 where a CFR process was performed and which shows reduced peak magnitudes (e.g., less than about 0.78). Similarly, plot 708 (FIG. 7B) and plot 714 (FIG. 7C) illustrate peaks 710, 716 for datasets where a CFR process was not performed, as well as datasets 712, 718 where a CFR process was performed. As before, the reduced peaks provided by the CFR process results in an increased efficiency of the CATV amplifier.

Figure 8A:
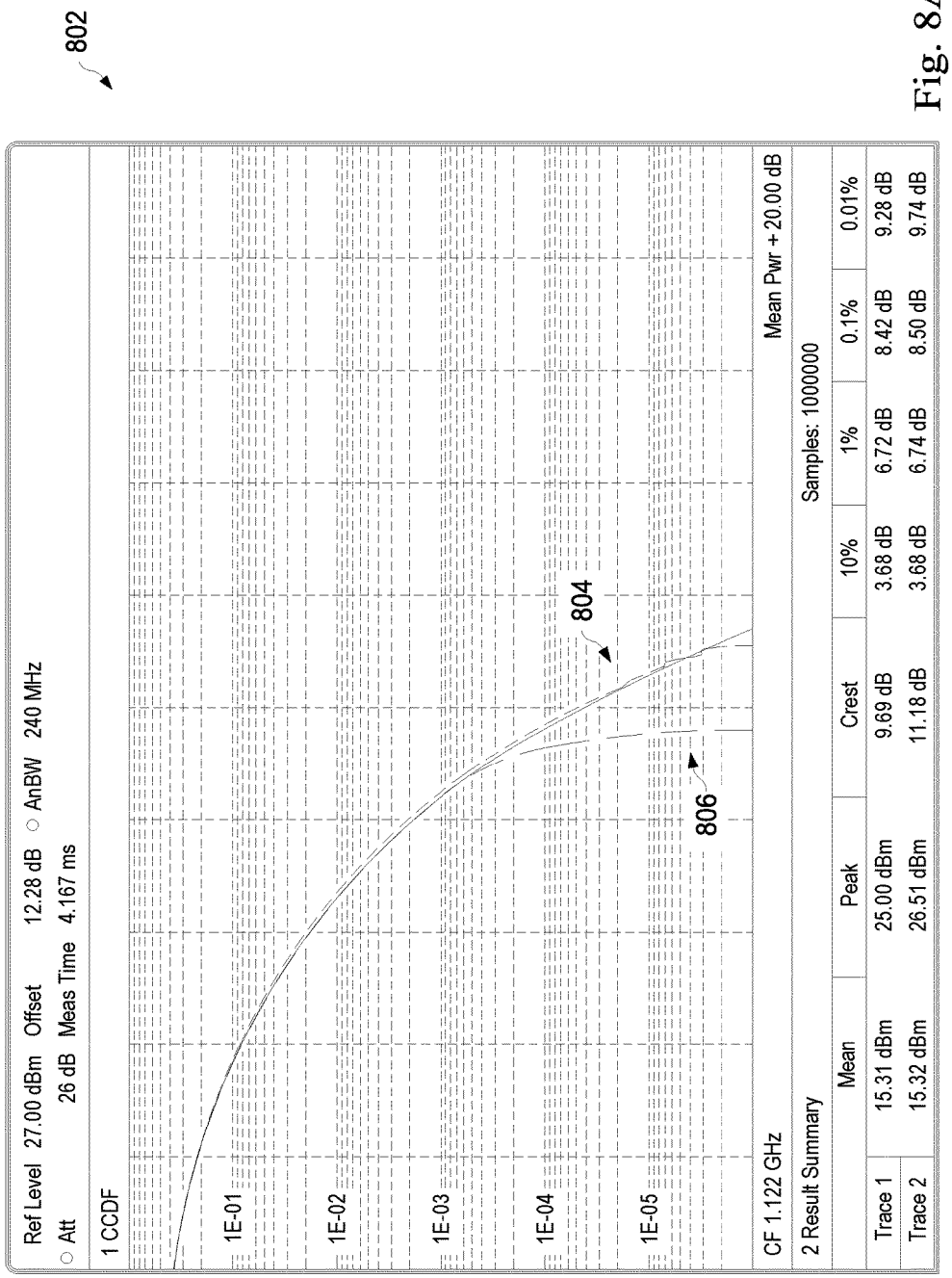
FIG. 8A illustrates a cumulative distribution function (CCDF) plot for a single carrier, showing the effect of performing a CFR process, in accordance with some embodiments.

With reference now to FIG. 8A, illustrated therein is a cumulative distribution function (CCDF) plot 802 for a single carrier at 1122 MHz showing a first CCDF curve 804 without performing a CFR process and a second CCDF curve 806 resulting from performing a CFR process. CCDF curves are used to show how much time a signal spends at or above a given power level, where the power level is expressed in dB relative to an average signal power (e.g., crest factor). Stated another way, CCDF curves are used to show a probability of the signal being at or above the given power level. Referring to FIG. 8A, the x-axis shows a dB value above the average signal power (e.g., crest factor), and the y-axis shows the percent of time that the signal spends at or above the power level specified by the x-axis. As compared to the first CCDF curve 804 (without CFR), the second CCDF curve 806 (with CFR) exhibits about a 2 dB reduction in crest factor. As a result, the CATV amplifier is expected to provide more consistent and more efficient performance. FIG. 8B provides a plot 808 that illustrates a power spectrum 810 for which the CFR process has been performed, corresponding to the second CCDF curve 806 (with CFR) and where the crest factor has been reduced by the CFR process.

Figure 9A:
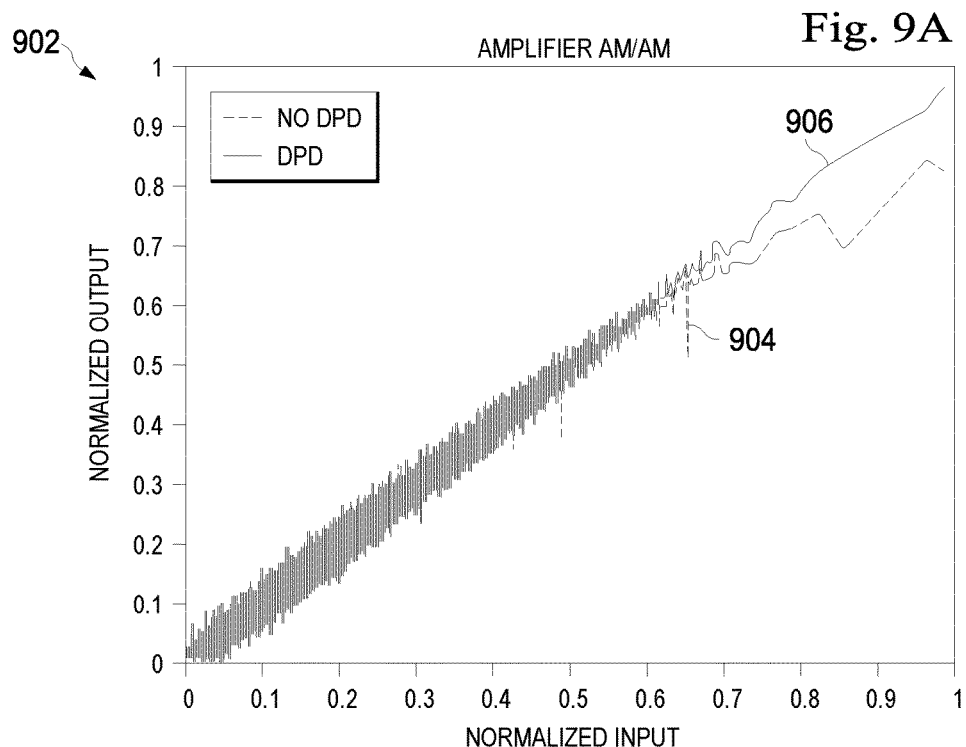
FIGS. 9A and 9B provide plots of a CATV amplifier transfer function that show the amplitude-to-amplitude distortion (AM/AM), and which illustrate the effect of performing one or both of a DPD process and a CFR process, in accordance with some embodiments.
Figure 9B:
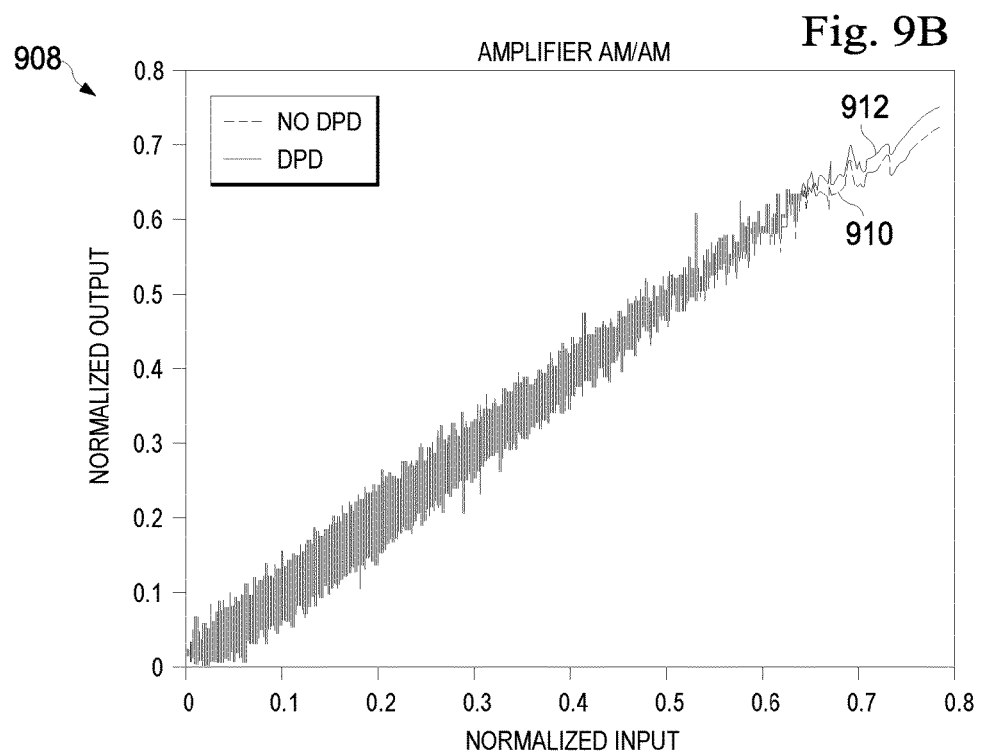

Referring to FIGS. 9A and 9B, illustrated therein are plots 902, 908 of a CATV amplifier transfer function that show the amplitude-to-amplitude distortion (AM/AM), where the AM/AM distortion is used to measure a signal's gain compression or expansion. In other words, the non-linearity of the AM/AM distortion will increase when the CATV amplifier gain is no longer constant with input power (e.g., when the output power is no longer linearly related to the input power). In the present example, the plot 902 (FIG. 9A) provides data where a CFR process is not performed, and the plot 908 (FIG. 9B) provides data where a CFR process is performed. Further, the plot 902 includes a first curve 904 for which a DPD process is not performed, and a second curve 906 for which a DPD process is performed. Referring to the first curve 904, it can be seen that greater input power results in increased compression in the output power (e.g., evident of increased CATV amplifier non-linearity). Using a DPD process (without CFR), the second curve 906 shows that it is possible to substantially correct the CATV amplifier non-linearity and reduce the signal compression. The plot 908 also includes a first curve 910 for which a DPD process is not performed, and a second curve 912 for which a DPD process is performed. By performing the CFR process and reducing the PAPR (for the data shown in the plot 908), the normalized input power is limited to about 0.8. As such, and with reference to the first curve 910 (without DPD), there is relatively little signal compression, resulting in a more controlled and efficient performance of the CATV amplifier. In this example, using a DPD process (with CFR), the second curve 912 shows minor improvement as compared to the first curve 910 because by constraining the input power (by the CFR process), there is less non-linearity for the DPD process to correct.

Figure 10A:
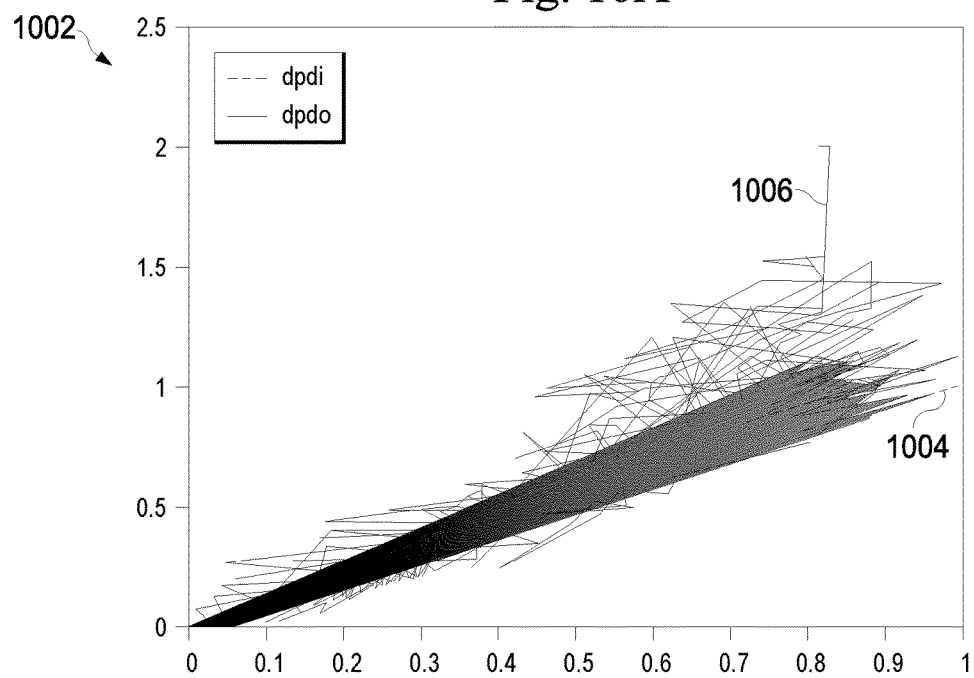
FIGS. 10A and 10B provide plots of DPD output stability performance, and showing the effect of performing a CFR process, in accordance with some embodiments.
Figure 10B:
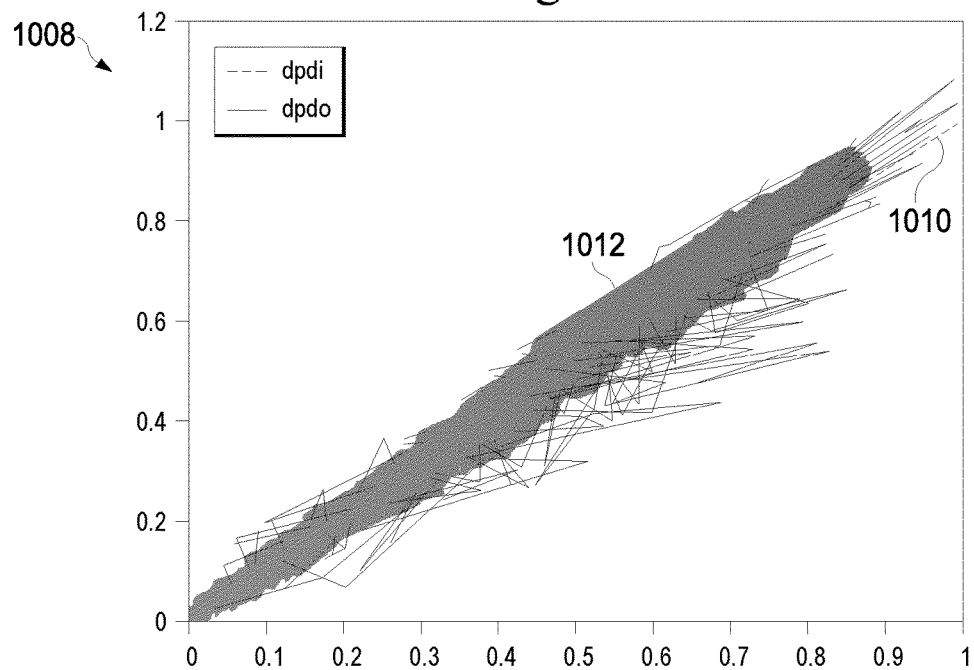

FIGS. 10A and 10B provide exemplary DPD performance (e.g., DPD output stability performance) with and without using a CFR process. FIG. 10A includes a plot 1002 that provides data where a CFR process is not performed, and FIG. 10B includes a plot 1008 that provides data where a CFR process is performed. Further, the plot 1002 (without CFR) includes a first curve 1004 representing a DPD input signal, and a second curve 1006 representing a DPD output signal. In this example, the DPD output signal (1006) is not stable without the CFR process and begins to diverge beyond a DPD output signal range of about 2. As discussed above, greater input power results in increased compression in the output power as the CATV amplifier has more non-linearity. To avoid operating the CATV amplifier in such high power regions, a CFR process can be performed. For example, the plot 1008 (with CFR) includes a first curve 1010 representing a DPD input signal, and a second curve 1012 representing a DPD output signal. In this example, and because a CFR process is performed, the DPD output signal (1012) is stable and does not diverge. For the data of plot 1008, a 1.3 dB CFR was applied. However, in various embodiments, the amount of applied CFR may be tuned as needed for a particular CATV amplifier or for a particular installation/deployment. In addition, while the present disclosure has described both the benefits of DPD and CFR, it is understood that various embodiments may employ one or both of a DPD process and a CFR process. However, in at least some examples, by using both a DPD process and a CFR process for a given deployment, maximum CATV amplifier efficiency may be achieved while also avoiding DPD divergence.

With reference to FIG. 11, illustrated therein is a table including modulation error ratio (MER) data for a CATV amplifier showing the effect of applying the corrections provided by the DPD-CFR system 304 on the MER data. By way of example, MER is a measure used to quantify the performance of a digital radio (or digital TV) transmitter or receiver in a communications system using digital modulation (such as QAM). For the example of FIG. 11, the CATV amplifier module under test is operable at V=34V. To compare the MER data to cable industry specifications: MER=41 dB, 4 KQAM, 76.8 dbmV/75Ω. The CATV amplifier is tested with six carriers, where the first carrier is a 4K QAM signal with a carrier frequency of 204 MHz, the second carrier is a 4K QAM signal with a carrier frequency of 396 MHz, the third carrier is a 4K QAM signal with a carrier frequency of 588 MHz, the fourth carrier is a 4K QAM signal with a carrier frequency of 786 MHz, the fifth carrier is a 4K QAM signal with a carrier frequency of 930 MHz, and the sixth carrier is a 4K QAM signal with a carrier frequency of 1122 MHz. In a first test 1102, with the CATV amplifier operating with a bias current of 440 mA and without either DPD or CFR corrections, none of the tested carriers meet the specification of MER=41 dB. In a second test 1104, with the CATV amplifier operating with a bias current of 440 mA, with DPD correction but without CFR correction, the first carrier does not meet the specification of MER=41 dB. Moreover, in the second test 1104, DPD stability is degraded and DPD divergence occurs. In a third test 1106, with the CATV amplifier operating with a bias current of 440 mA and with both DPD and CFR corrections applied, all of the tested carriers meet the specification of MER=41 dB and DPD divergence is avoided. It is also noted that by operating the CATV amplifier with a bias current of 440 mA (as compared to some applications that operate the CATV amplifier with a bias current of 530 mA) a reduction of about 3 Watts per amplifier may be achieved while maintaining MER performance.

Figure 12:
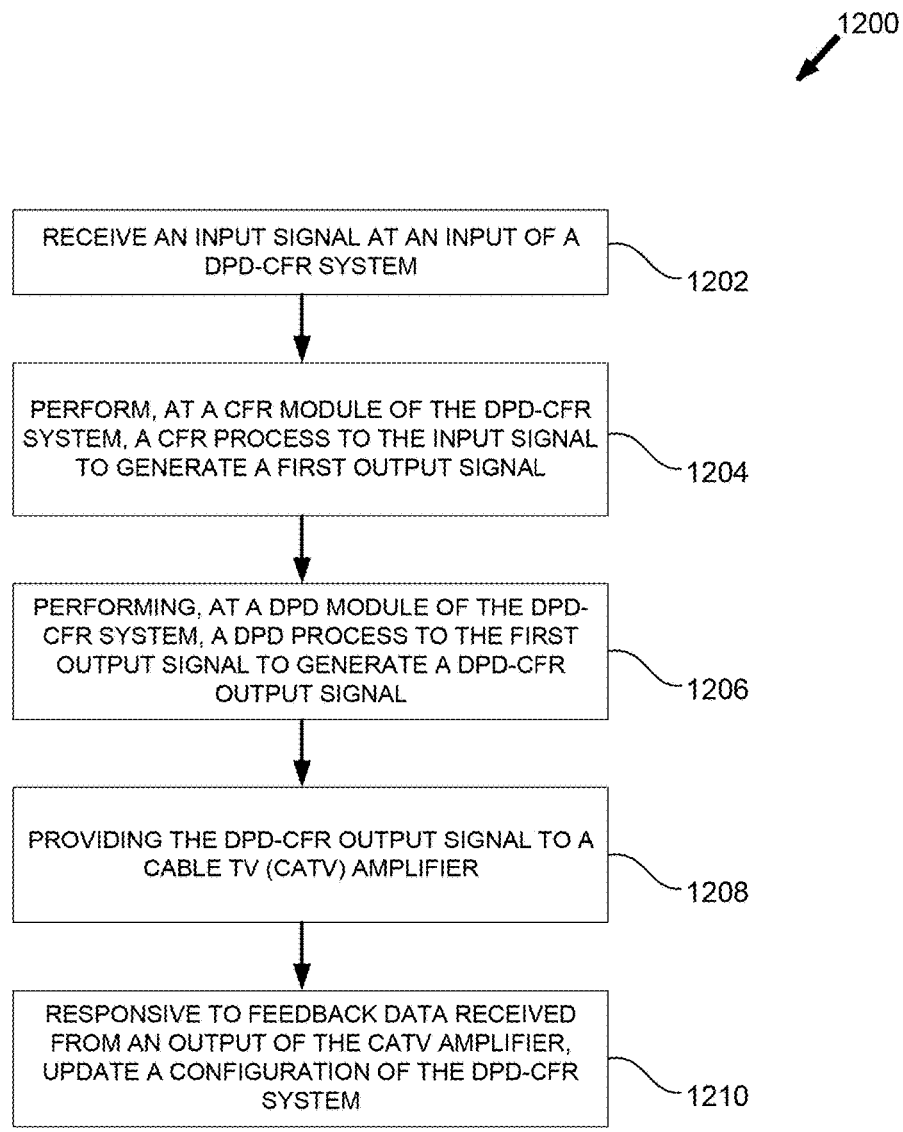
FIG. 12 is a flow diagram illustrating a method for performing a crest factor reduction process and a digital predistortion process in a DPD-CFR system, according to some embodiments.

Referring now to FIG. 12, illustrated therein is a method 1200 for performing a crest factor reduction process and a digital predistortion process in a DPD-CFR system, in accordance with various embodiments. The method 1200 begins at block 1202 where an input signal is received at an input of a DPD-CFR system, such as the DPD-CFR system 304 of FIG. 4A. As discussed above, and in some embodiments, the input signal may include the input signal x(n) (FIG. 4A), which may further include the composite signal c(n) generated by the DUC 302 (FIG. 3). In some examples, the method 1200 proceeds to block 1204 where a CFR process is performed, at a CFR module of the DPD-CFR system, to the input signal to generate a first output signal. For example, the CFR process may be performed by the CFR module 404 (FIG. 4A). In various cases, the CFR process is performed in order to reduce a peak-to-average power ratio (PAPR) of the input signal. In some embodiments, the input signal includes the signal noted as $\widetilde{x(n)}_{tilt}$ (FIG. 4A), and the first output signal includes the signal noted as $\widetilde{\phantom{x}}^{cfr}_{tilt}$ (FIG. 4A). The method 1200 proceeds to block 1206 where a DPD process is performed, at a DPD module of the DPD-CFR system, to the first output signal to generate a DPD-CFR output signal. In some embodiments, the DPD module includes a non-linear datapath coupled to an output of the CFR module. In addition, the non-linear datapath of the DPD module may include the non-linear datapath 406 of FIG. 4B. As such, the non-linear datapath may include a plurality of parallel datapath elements. In some examples, the plurality of parallel datapath elements includes the video bandwidth DPD datapath 404, the baseband DPD datapath 406, the $2^{nd}$ harmonics DPD datapath 408, and the $3^{rd}$ harmonics DPD datapath 410. In some examples, each of the different parallel datapath elements may be used to add a different aspect of the inverse non-linear behavior of a CATV amplifier to an incoming signal. In some embodiments, a combiner combines an output of each of the plurality of parallel datapath elements to generate a composite signal x'(n) (FIG. 4B), where the composite signal x'(n) models the baseband, video, and harmonic components of the CATV amplifier. In various embodiments, the method 1200 proceeds to block 1208 where the DPD-CFR output signal is provided to a CATV amplifier (e.g., such as the CATV amplifiers 212 of FIG. 2). In accordance with embodiments of the present disclosure, the DPD-CFR output signal is configured to reduce a signal's PAPR and to compensate for a plurality of non-linear components of the CATV amplifier. The method 1200 may then proceed to block 1210 where feedback data received from an output of a CATV amplifier (e.g., such as feedback data 308 of FIG. 3) may be used to update a configuration of the DPD-CFR system. It will be understood that additional method steps may be implemented before, during, and after the method 1200, and some method steps described above may be replaced or eliminated in accordance with various embodiments of the method 1200, without departing from the scope of the present disclosure.

It is noted that various configurations (e.g., the components of the cable network 200, the DFE system 300, and the DPD-CFR system 304, the number of parallel datapath elements in FIG. 4B, as well as other features and components illustrated in the figures) are exemplary only and not intended to be limiting beyond what is specifically recited in the claims that follow. It will be understood by those skilled in the art that other configurations may be used. Also, while an exemplary cable network 200 is illustrated, the DPD-CFR system disclosed herein may be used to in other communication systems, for example where the other communication systems deploy an amplifier exhibiting detrimental non-linear behavior.

Although particular embodiments have been shown and described, it will be understood that it is not intended to limit the claimed inventions to the preferred embodiments, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A crest factor reduction (CFR) system, comprising:
   a digital tilt filter coupled to an input of the CFR system, wherein the digital tilt filter is configured to receive a system input signal and generate a digital tilt filter output signal at a digital tilt filter output;
   a CFR module coupled to the digital tilt filter output, wherein the CFR module is configured receive the digital tilt filter output signal and perform a CFR process to the digital tilt filter output signal to generate a CFR module output signal at a CFR module output; and
   a digital tilt equalizer coupled to the CFR module output, wherein the digital tilt equalizer is configured to receive the CFR module output signal and generate a system output signal.

2. The CFR system of claim 1, further comprising:
   a digital predistortion (DPD) module coupled to the CFR module output, wherein the DPD module is configured to receive the CFR module output signal and perform a DPD process to the CFR module output signal to generate a DPD module output signal at a DPD module output;
   wherein the digital tilt equalizer is coupled to the DPD module output, and wherein the digital tilt equalizer is configured to receive the DPD module output signal and generate the system output signal.

3. The CFR system of claim 1, wherein the system input signal has a first peak-to-average power ratio (PAPR), and wherein the CFR module output signal has a second PAPR less than the first PAPR.

4. The CFR system of claim 2, further comprising:
   a first linear datapath coupled to the input of the CFR system and in parallel with the CFR module and the DPD module to generate a first time-delayed signal; and
   a first combiner configured to combine a digital tilt equalizer output signal and the first time-delayed signal to generate the system output signal.

5. The CFR system of claim 4, further comprising:
   a second linear datapath coupled to the input of the CFR system and in parallel with the CFR module to generate a second time-delayed signal;
   a second combiner configured to combine the CFR module output signal and the second time-delayed signal to generate a first output signal; and
   a third combiner configured to combine the first output signal and the DPD module output signal to generate the system output signal.

6. The CFR system of claim 2, wherein the DPD module further comprises:
   a non-linear datapath coupled to the CFR module output, wherein the non-linear datapath includes a plurality of parallel datapath elements each coupled to the CFR module output, wherein each of the plurality of parallel datapath elements is configured to add a different inverse non-linear component to the CFR module output signal corresponding to a non-linear component of an amplifier, and wherein a combiner is configured to combine an output of each of the plurality of parallel datapath elements to generate the DPD module output signal.

7. The CFR system of claim 1, wherein a digital-to-analog converter (DAC) is configured to receive the system output signal and generate a DAC output signal, wherein an analog tilt filter is configured to receive the DAC output signal and generate an analog tilt filter output signal, and wherein the digital tilt filter is configured to model the analog tilt filter.

8. The CFR system of claim 7, wherein the digital tilt equalizer is configured to model an inverse of the analog tilt filter.

9. The CFR system of claim 2, further comprising:
   a single side band Hilbert filter, wherein a single side band Hilbert filter input is configured to receive the DPD module output signal, and wherein a single side band Hilbert filter output is coupled to a digital tilt equalizer input.

10. The CFR system of claim 1, further comprising:
    an adaptation engine configured to receive feedback data from an amplifier output, wherein based on the feedback data, the adaptation engine is configured to update a configuration of the CFR module.

11. A digital front-end (DFE) system configured to perform a crest factor reduction (CFR) process, the DFE system comprising:

a digital upconverter (DUC) configured to receive and translate a baseband data input signal to generate a composite signal;

a CFR system including a digital tilt filter, a CFR module, and a digital tilt equalizer, wherein the digital tilt filter is configured to receive the composite signal and generate a digital tilt filter output signal, wherein the CFR module is configured to receive the digital tilt filter output signal and perform the CFR process to the digital tilt filter output signal to generate a CFR module output signal, wherein the digital tilt equalizer is configured to receive the CFR module output signal and generate a CFR system output signal, and wherein the CFR system output signal is coupled to an amplifier; and an adaptation engine configured to receive feedback data from an output of the amplifier, wherein based on the feedback data, the adaptation engine is configured to update a configuration of the CFR system.

12. The DFE system of claim 11, wherein the CFR process is configured to reduce a peak-to-average power ratio (PAPR) of the digital tilt filter output signal.

13. The DFE system of claim 11, wherein the CFR system further comprises:

a digital predistortion (DPD) module including a non-linear datapath coupled to a CFR module output, wherein the non-linear datapath includes a plurality of parallel datapath elements each coupled to the CFR module output, wherein each of the plurality of parallel datapath elements is configured to model a different inverse non-linear component corresponding to a non-linear component of the amplifier, wherein a combiner is configured to combine an output of each of the plurality of parallel datapath elements to generate a DPD module output signal, and wherein the digital tilt equalizer is configured to receive the DPD module output signal and generate the CFR system output signal.

14. The DFE system of claim 11, wherein a digital-to-analog converter (DAC) is configured to receive the CFR system output signal and generate a DAC output signal, wherein an analog tilt filter is configured to receive the DAC output signal and generate an analog tilt filter output signal, and wherein the digital tilt filter is configured to model the analog tilt filter.

15. The DFE system of claim 14, wherein the digital tilt equalizer is configured to model an inverse of the analog tilt filter.

16. A method, comprising:

receiving, at a digital tilt filter of a crest factor reduction (CFR) system, an input signal and generating a digital tilt filter output signal at a digital tilt filter output;

performing, at a CFR module of the CFR system, a CFR process to the digital tilt filter output signal to generate a CFR module output signal, wherein the CFR process is configured to reduce a peak-to-average power ratio (PAPR) of the digital tilt filter output signal;

receiving, at a digital tilt equalizer of the CFR system, the CFR module output signal and generating a system output signal; and providing the system output signal to an amplifier.

17. The method of claim 16, further comprising:

responsive to feedback data received from an output of the amplifier, updating a configuration of the CFR system.

18. The method of claim 16, further comprising:

performing, at a digital predistortion (DPD) module of the CFR system, a DPD process to the CFR module output signal to generate a DPD module output signal; and receiving, at the digital tilt equalizer of the CFR system, the DPD module output signal and generating the system output signal.

19. The method of claim 18, wherein the DPD module further comprises:

a non-linear datapath coupled to an output of the CFR module, wherein the non-linear datapath includes a plurality of parallel datapath elements each coupled to the CFR module output, wherein each of the plurality of parallel datapath elements is configured to model a different inverse non-linear component corresponding to a non-linear component of the amplifier, and wherein a combiner is configured to combine an output of each of the plurality of parallel datapath elements to generate the DPD module output signal.

20. The method of claim 16, further comprising:

responsive to providing the system output signal to the amplifier and while operating the amplifier in a non-linear region, reducing a power consumption of the amplifier.

* * * * *

UNITED STATES PATENT AND TRADEMARK OFFICE
CERTIFICATE OF CORRECTION

| | | |
|---|---|---|
| PATENT NO. | : 10,411,656 B1 | Page 1 of 1 |
| APPLICATION NO. | : 16/142893 | |
| DATED | : September 10, 2019 | |
| INVENTOR(S) | : Christopher H. Dick et al. | |

It is certified that error appears in the above-identified patent and that said Letters Patent is hereby corrected as shown below:

In the Claims

Column 20, Line 23, in Claim 5 delete "CFR" and insert -- DPD --, therefor

Signed and Sealed this
Twenty-first Day of December, 2021

Drew Hirshfeld
*Performing the Functions and Duties of the*
*Under Secretary of Commerce for Intellectual Property and*
*Director of the United States Patent and Trademark Office*